US010564197B2

(12) United States Patent
Kim et al.

(10) Patent No.: US 10,564,197 B2
(45) Date of Patent: Feb. 18, 2020

(54) AUDIO SPECTRUM ANALYZER AND METHOD OF ARRANGING RESONATORS INCLUDED THEREIN

(71) Applicant: SAMSUNG ELECTRONICS CO., LTD., Suwon-si (KR)

(72) Inventors: Cheheung Kim, Yongin-si (KR); Sungchan Kang, Hwaseong-si (KR); Yongseop Yoon, Seoul (KR); Choongho Rhee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 67 days.

(21) Appl. No.: 15/450,416

(22) Filed: Mar. 6, 2017

(65) Prior Publication Data
US 2018/0038901 A1 Feb. 8, 2018

(30) Foreign Application Priority Data

Aug. 3, 2016 (KR) ........................ 10-2016-0099059

(51) Int. Cl.
G01P 3/42 (2006.01)
G01N 29/14 (2006.01)
G01N 29/24 (2006.01)
H04R 29/00 (2006.01)
H01L 41/053 (2006.01)
(Continued)

(52) U.S. Cl.
CPC ............. G01R 23/16 (2013.01); G01H 3/08 (2013.01); G01H 11/08 (2013.01); H03H 9/2426 (2013.01); H04R 1/245 (2013.01); H04R 17/02 (2013.01); H04R 19/005 (2013.01); H04R 19/04 (2013.01); H04R 2201/003 (2013.01)

(58) Field of Classification Search
CPC . G01R 23/16; G01P 3/42; H03H 9/24; G01N 29/14; G01N 29/24; H04R 17/02; H04R 29/00; H01L 41/053; H01L 41/18
See application file for complete search history.

(56) References Cited

U.S. PATENT DOCUMENTS 5,298,873 A  3/1994 Ala-Kojola
5,856,722 A  1/1999 Haronian et al.
(Continued)

FOREIGN PATENT DOCUMENTS

EP  0849574 A2  6/1998
EP  0849574 A3  6/1998
(Continued)

OTHER PUBLICATIONS

Communication dated Nov. 23, 2017, issued by the European Patent Office in counterpart European Patent Application No. 17180117.8.
(Continued)

Primary Examiner — Neel D Shah
(74) Attorney, Agent, or Firm — Sughrue Mion, PLLC

(57) ABSTRACT

A spectrum analyzer includes: a support substrate; and a plurality of resonators that have center frequencies different from each other, one end of each of the plurality of resonators being fixed to the support substrate. The plurality of resonators are arranged so that an interval between resonators having adjacent center frequencies is secured by a certain value or greater, thus reducing coupling and increasing analysis accuracy.

22 Claims, 23 Drawing Sheets

(51) Int. Cl.
*G01R 23/16* (2006.01)
*H03H 9/24* (2006.01)
*G01H 3/08* (2006.01)
*G01H 11/08* (2006.01)
*H04R 1/24* (2006.01)
*H04R 17/02* (2006.01)
*H04R 19/00* (2006.01)
*H04R 19/04* (2006.01)

(56) References Cited

U.S. PATENT DOCUMENTS

| | | | |
|---|---|---|---|
| 7,863,714 B2 | 1/2011 | Diamond et al. | |
| 8,103,027 B2 | 1/2012 | Zhang et al. | |
| 8,170,244 B2 | 5/2012 | Ryan et al. | |
| 9,479,884 B2 | 10/2016 | Kim | |
| 2005/0193822 A1* | 9/2005 | Amano et al. | G01L 11/00 73/704 |
| 2010/0033058 A1 | 2/2010 | Lee et al. | |
| 2012/0206018 A1* | 8/2012 | Kawakubo et al. | H01L 41/053 310/344 |
| 2016/0050506 A1 | 2/2016 | Kim | |

FOREIGN PATENT DOCUMENTS

| | | |
|---|---|---|
| JP | 9-264879 A | 10/1997 |
| JP | 2000-201391 A | 7/2000 |
| JP | 2008-8683 A | 1/2008 |
| KR | 10-2016-0020287 A | 2/2016 |
| WO | 2015111581 A1 | 7/2015 |

OTHER PUBLICATIONS

Xu Yixue et al., "Vocal Tract Characteristic on Long-Term Formant Distribution", ICCSN, 2012.

* cited by examiner

AUDIO SPECTRUM ANALYZER AND METHOD OF ARRANGING RESONATORS INCLUDED THEREIN

CROSS-REFERENCE TO RELATED APPLICATION

This application claims priority from Korean Patent Application No. 10-2016-0099059, filed on Aug. 3, 2016 in the Korean Intellectual Property Office, the disclosure of which is incorporated herein by reference in its entirety.

BACKGROUND

1. Field

Exemplary embodiments relate to audio spectrum analyzers and methods of arranging resonators included therein.

2. Description of the Related Art

Spectrum analyzers, which analyze audio or vibration spectrums, may be used for situation recognition, speech recognition, speaker recognition, or the like in cellphones, computers, home appliances, vehicles, or smart home environments, or may be mounted on home appliances, vehicles, buildings, or the like to analyze vibration information.

Generally, frequency domain information of an audio signal is acquired in such a way that an audio signal input to a microphone having wideband characteristics passes through an analog-to-digital converter (ADC) and then Fourier-transformed. Such a frequency information acquisition method imposes a heavy burden in terms of the amount of computation required for Fourier transformation and has a trade-off relationship between frequency resolution and time resolution. Thus, it may be difficult to improve resolutions of both time information and frequency information.

SUMMARY

Exemplary embodiments address at least the above problems and/or disadvantages and other disadvantages not described above. Also, the exemplary embodiments are not required to overcome the disadvantages described above, and may not overcome any of the problems described above.

One or more exemplary embodiments audio spectrum analyzers with improved resolution.

Further, one or more exemplary embodiments methods of arranging resonators, capable of reducing coupling between resonators having different center frequencies.

According to an aspect of an exemplary embodiment, there is provided a spectrum analyzer including: a support substrate; and a plurality of resonators that have center frequencies different from each other, one end of each of the plurality of resonators being fixed to the support substrate.

Each of the plurality of resonators may include: a fixing portion fixed to the support substrate; a movable portion movable in response to an audio signal; and a sensor configured to sense a movement of the movable portion.

The support substrate may include a through-hole, and the movable portion of each of the plurality of resonators faces the through-hole.

The plurality of resonators may be arranged in a flat formation without overlapping one another.

The fixing portions of the plurality of resonators may be arranged to have a trajectory along a cross-sectional shape of the through-hole.

A cross-sectional shape of the through-hole may be a rectangular shape, and the fixing portions of the plurality of resonators may be arranged to have a trajectory along two parallel sides of the rectangular shape.

A separation distance between two resonators having center frequencies immediately adjacent to each other, among the plurality of resonators, may be greater than a shortest separation distance among separation distances between the plurality of resonators.

A center frequency difference between two resonators spatially immediately adjacent to each other, among the plurality of resonators, may be greater than a smallest center frequency difference among center frequency differences between the plurality of resonators.

When N denotes a number of the plurality of resonators, $R_k$ denotes the plurality of resonators in order of center frequencies, k denotes a natural number from 1 to N, m is any one of aliquots of N other than 1 and N, and j is a natural number from 1 to m, the plurality of resonators are grouped into m subgroups SG_j. When j is different from m, each of the subgroups SG_j includes resonators $R_k$ satisfying (k mod m)=j. When j is equal to m, each of the subgroups SG_j includes resonators $R_k$ satisfying (k mod m)=0, and resonators $R_k$ belonging to a same subgroup SG_j are arranged adjacent to each other in order of the center frequencies.

The subgroups SG_j may be arranged in order of the j values.

m may be one medium value or two median values of the aliquots of N.

m may be a natural number greater than 2, and the fixing portions of the plurality of resonators may be arranged to have a trajectory in a polygonal shape, a circular shape, or a closed curve shape.

The fixing portions of the plurality of resonators may are arranged to have a trajectory in an m-polygonal shape with m sides.

m may be an even number, and he fixing portions of the plurality of resonators may be arranged to have a trajectory in a shape of two straight lines parallel to each other.

The fixing portions of the resonators belonging to subgroups SG_1 to SG_m/2 among the subgroups SG_j are arranged to have a trajectory in a shape of a first straight line, and the fixing portions of the resonators belonging to subgroups SG_(m/2)+1 to SG_m among the subgroups SG_j are arranged to have a trajectory in a shape of a second straight line parallel to the first straight line.

Resonators in a first subgroup of the plurality of resonators and resonators in a second subgroup of the plurality resonators may face each other and may be arranged in reverse order of the center frequencies.

When the center frequencies of the plurality of resonators are within a range between a first frequency F1 and a second frequency F2, the center frequencies of the plurality of resonators may be F1+(k−1)(F2−F1)/(N−1), respectively. Here, N is a number of the plurality of resonators, and k is a natural number from 1 to N.

The center frequencies of the plurality of resonators may be set at equal-ratio intervals.

According to an aspect of another exemplary embodiment, there is provided a method of arranging resonators of a spectrum analyzer including: setting a frequency range of frequency f a number N of a plurality of resonators $R_k$, when k is a natural number from 1 to N; setting center frequencies of the plurality of resonators $R_k$ to be different values within the set frequency range; setting an arrangement period p of the plurality of resonators $R_k$; and arranging the plurality of resonators $R_k$ so that a pitch between two resonators of the plurality of resonators $R_k$, which have the center frequencies immediately adjacent to each other, is 2p or greater.

The frequency range may be set to be between F1 and F2, the center frequencies of the plurality of resonators $R_k$ may be set to be F1+(k−1)(F2−F1)/(N−1), and the plurality of resonators may be arranged so that a center frequency difference between two resonators of the plurality of resonators $R_k$, which are spatially immediately adjacent to each other, is 2(F2−F1)/N or greater.

The center frequencies of the plurality of resonators $R_k$ may be set at equal-ratio intervals r, and the plurality of resonators $R_k$ are arranged so that a center frequency ratio between two resonators of the plurality of resonators ($R_k$), which are spatially immediately adjacent to each other, is 2r or greater.

The plurality of resonators $R_k$ may be grouped into m subgroups SG_j when j is a natural number from 1 to m, and m is any one of aliquots of N other than 1 and N. When j is different from m, each of the subgroups SG_j may include resonators $R_k$ satisfying (k mod m)=j. When j is equal to m, each of the subgroups SG_j may include resonators $R_k$ satisfying (k mod m)=0. Resonators $R_k$ belonging to a same subgroup SG_j may be arranged adjacent to each other in order of the center frequencies.

According to an aspect of another exemplary embodiment, there is provided a spectrum analyzer including: a support substrate including a through-hole; and a plurality of resonators. Each of the plurality of resonators has a first end that is fixed to the support substrate and a second end that extends from the first end toward the through-hole to be apart from the support substrate. The plurality of resonators are classified into m number of groups, wherein m is a natural number. Resonators in a same group among the m number of groups are disposed to be adjacent to each other. A difference between a central frequency of a first resonator in one group and a central frequency of a second resonator in the one group is a multiplication of m and Δf, wherein the Δf is F divided by N when F is a frequency range in which each of the plurality of resonators operates and N is a number of the plurality of resonators.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
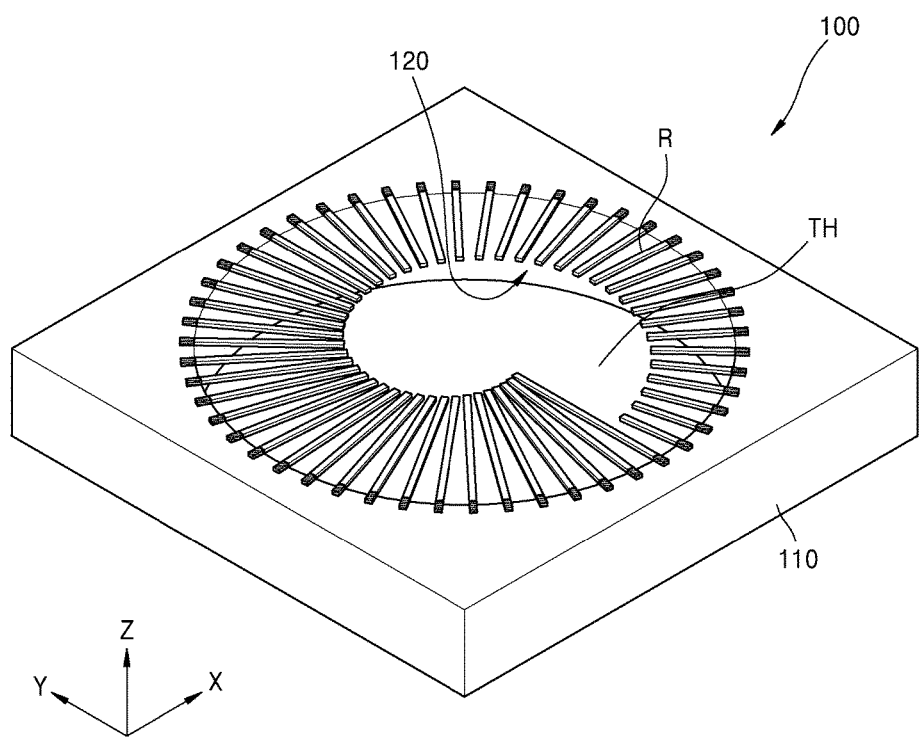
FIG. 1 is a perspective view illustrating a schematic configuration of a spectrum analyzer according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail. It will be understood that when a layer, region, or component is referred to as being "formed on," another layer, region, or component, it can be directly or indirectly formed on the other layer, region, or component.

As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

As used herein, the term "the" or similar indicative terms correspond to both the singular form and the plural form.

Operations constituting a method may be performed in an appropriate order, unless operations clearly indicate otherwise. The method is not limited to the order of operations described herein. The use of any and all examples, or exemplary language (e.g., "such as") provided herein, is intended merely to better illuminate the underlying concept and does not pose a limitation on the scope of the disclosure.

Figure 2A:
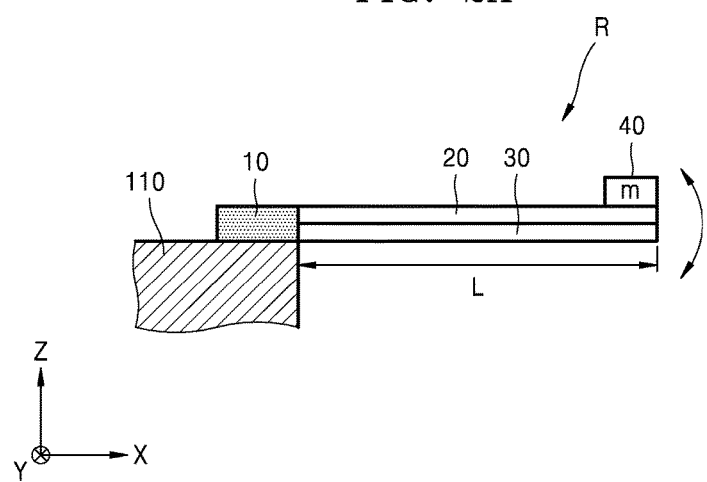
FIGS. 2A and 2B are cross-sectional views illustrating a configuration of one resonator from among a plurality of resonators included in the spectrum analyzer of FIG. 1.
Figure 2B:
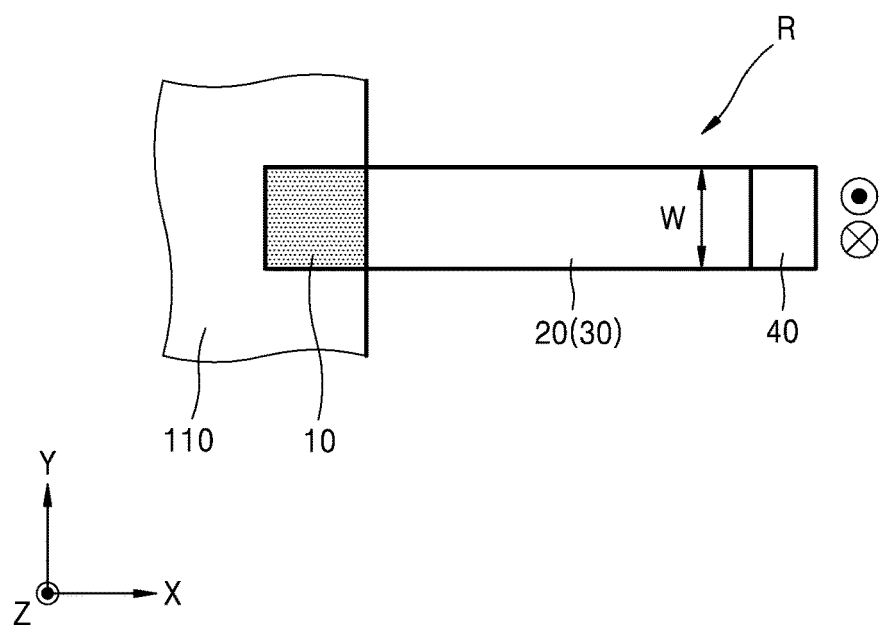
Figure 2C:
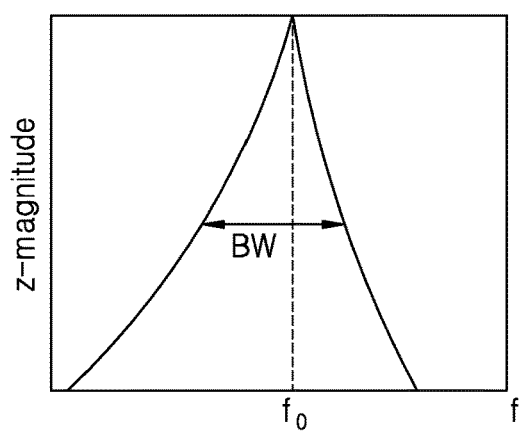
FIG. 2C is a graph showing frequency response characteristics of the one resonator.

FIG. 1 is a perspective view illustrating a schematic configuration of a spectrum analyzer 100 according to an exemplary embodiment. FIGS. 2A and 2B are cross-sectional views illustrating a configuration of one resonator R from among a plurality of resonators included in the spectrum analyzer 100 of FIG. 1, and FIG. 2C is a graph showing frequency response characteristics of the one resonator R.

Referring to FIG. 1, the spectrum analyzer 100 includes a support substrate 110 and a resonator array 120. The resonator array 120 includes a plurality of resonators R, one end of each of which is fixed to the support substrate 110, and center frequencies of the resonators R are different from one another.

As illustrated in FIGS. 2A and 2B, the resonator R includes a fixing portion 10 fixed to the support substrate 110, a movable portion 30 movable in response to a signal, and a sensor 20 configured to sense a movement of the movable portion 30. The resonator R may further include a mass body 40 configured to provide a certain mass m to the movable portion 30.

A through-hole TH may be formed in the support substrate 110, and the plurality of resonators R may be arranged so that the movable portion 30 of each of the plurality of resonators R faces the through-hole TH. The through-hole TH provides a space where the movable portion 30 is vibrated by an external force, and there is no particular limitation to a shape or size thereof as long as the through-hole TH satisfies this condition. The support substrate 110 may include various materials, such as silicon or the like.

The plurality of resonators R may be arranged in a flat form without overlapping one another. That is, the plurality of resonators R may be arranged to be simultaneously exposed to a physical signal input path as a whole. An arrangement trajectory of the fixing portions 10 of the plurality of resonators R may be along a cross-sectional shape of the through-hole TH. The through-hole TH is illustrated as having a circular shape, but embodiments are not limited thereto. The through-hole TH may have a polygonal shape or various closed curve shapes.

The movable portion 30 may include an elastic film. The elastic film may have a length of L and a width of W, which are factors to determine resonance characteristics of the resonator R together with the mass m of the mass body 40. The elastic film may include a silicone, a metal, or a polymer.

The sensor 20 may include a sensor layer configured to sense the movement of the movable portion 30. The sensor 20 may include, for example, a piezoelectric element. In this case, the sensor 20 may have a structure in which an electrode layer, a piezoelectric material layer, and an electrode layer are stacked. ZnO, SnO, PZT, $ZnSnO_3$, polyvinylidene fluoride (PVDF), poly(vinylidene fluoride-trifluoroethylene) (P(VDF-TrFE)), AlN, or PMN-PT may be used as the piezoelectric material. A metal material or various conductive materials may be used to form the electrode layer.

The resonators R may have a width of several micrometers or less, a thickness of several micrometers or less, and a length of several millimeters or less. The resonators R having ultra-small sizes may be manufactured by a microelectromechanical system (MEMS) process.

The resonator R vertically vibrates along a Z direction in response to an external signal, and a displacement value z is determined according to the following motion equation:

$$m\frac{d^2z}{dt^2} + c\frac{dz}{dt} + kz = F_0\cos\omega t$$

Here, c is a damping coefficient, k is the modulus of elasticity, and $F_0 \cos \omega t$ is a driving force and indicates an action caused by a signal input to the resonator R. The value of k is determined by a physical property and a shape of the movable portion 30.

Due to the motion equation, the resonator R shows frequency response characteristics having a center frequency $f_0$ and a bandwidth BW, as illustrated in FIG. 2C.

The center frequency $f_0$ is as follows:

$$f_0 = \frac{1}{2\pi}\sqrt{\frac{k}{m}}$$

The bandwidth BW means a frequency bandwidth representing half of a frequency response value (z-magnitude) at the center frequency $f_0$.

The resonators R included in the spectrum analyzer 100 are designed to have different center frequencies and may sense a frequency of a certain band with respect to the center frequency $f_0$.

Figure 3:
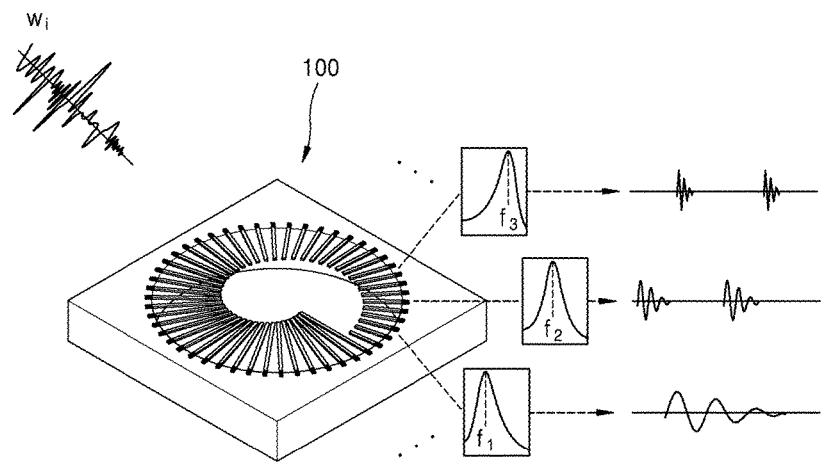
FIG. 3 is a conceptual diagram of an analysis of a frequency component of an audio signal performed by using the spectrum analyzer of FIG. 1.

FIG. 3 is a conceptual diagram of an analysis of a frequency component of an audio signal performed by using the spectrum analyzer 100 of FIG. 1.

When an audio signal Wi having various frequency components is input to the spectrum analyzer 100, each of the resonators R vibrates in response to a sensing frequency band of each of the resonators R among the frequency components included in the audio signal Wi. The center frequencies of the resonators R may be set so that the resonators R receive an audio signal having an audible frequency band of about 20 Hz to about 20 kHz, an ultrasonic band of about 20 kHz or greater, or an infrasound band of about 20 kHz or less.

Since the resonators R are vibrated by the input audio signal and the resonators R are vibrated in response to different audio frequency bands, the resonators R may sense different frequency bands.

For example, as illustrated in FIG. 3, the resonators, which respectively have center frequencies $f_1$, $f_2$, and $f_3$, output signals responsive to the corresponding frequency components. That is, since the outputs of the resonators carry corresponding frequency information, a frequency resolution is independently determined by the number of resonators. A time resolution may be equal to or in direction proportion to an instant output speed from each of the resonators.

Figure 4:
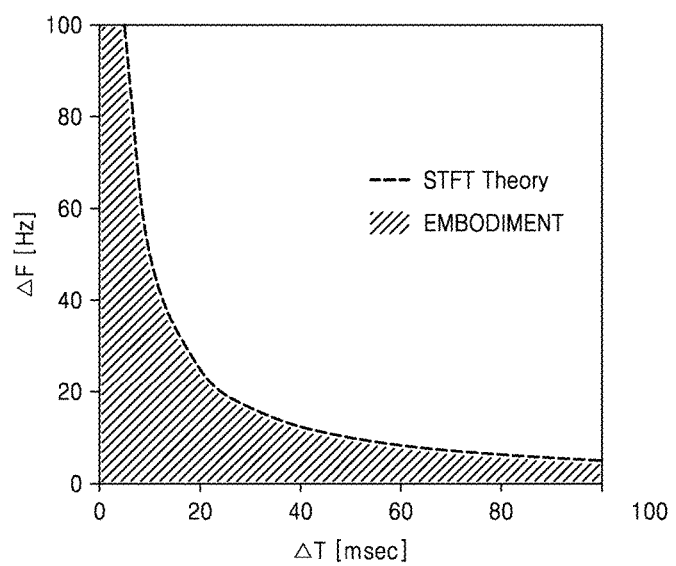
FIG. 4 is a graph showing a frequency resolution and a time resolution implemented by the spectrum analyzer of FIG. 1, when compared to the case of using a Fourier transform method.

FIG. 4 is a graph showing a frequency resolution and a time resolution implemented by the spectrum analyzer 100 of FIG. 1, when compared to the case of using a Fourier transform method.

According to a short-time Fourier transform (STFT) method, an input signal is divided into constant time intervals, i.e., frames, and fast Fourier transformation (TFT) is performed on each frame, so as to observe a change in frequency distribution according to time. If the frame is finely divided, a change according to time can be easily observed, but information inside the frame is reduced. Thus, frequency information becomes insufficient. If the frame is widely divided, frequency information becomes clear, but a temporal change becomes insensitive. This is called Gabor uncertainty or Fourier uncertainty. $\Delta T$ and $\Delta F$ are limited to values on a dashed line indicated in the graph. In the present exemplary embodiment, the frequency resolution and the time resolution may be independently secured without such limitations and can be selectively designed with any values within a hatched region.

In the spectrum analyzer 100 of FIG. 1, the plurality of resonators R are arranged according to the magnitude of the center frequencies, but exemplary embodiments are not limited thereto. The plurality of resonators R may be arranged in other arrangement methods capable of improving output characteristics.

As illustrated in FIG. 2C, the frequency response graph of the resonator R has a certain bandwidth BW. Thus, a Q value defined as $f_0/BW$ is finite. As the Q value increases, the frequency response characteristics become more sensitive. As the Q value decreases, the resonator also responds to a frequency of an adjacent band, as well as the center frequency. Since the plurality of resonators R are integrated within a limited space, coupling occurs between the resonators R. Since the coupling effect is related to both a spatial distance between the resonators R and a center frequency difference between the adjacent resonators R, it may be necessary to take these factors into account so as to reduce the coupling.

Figure 5:
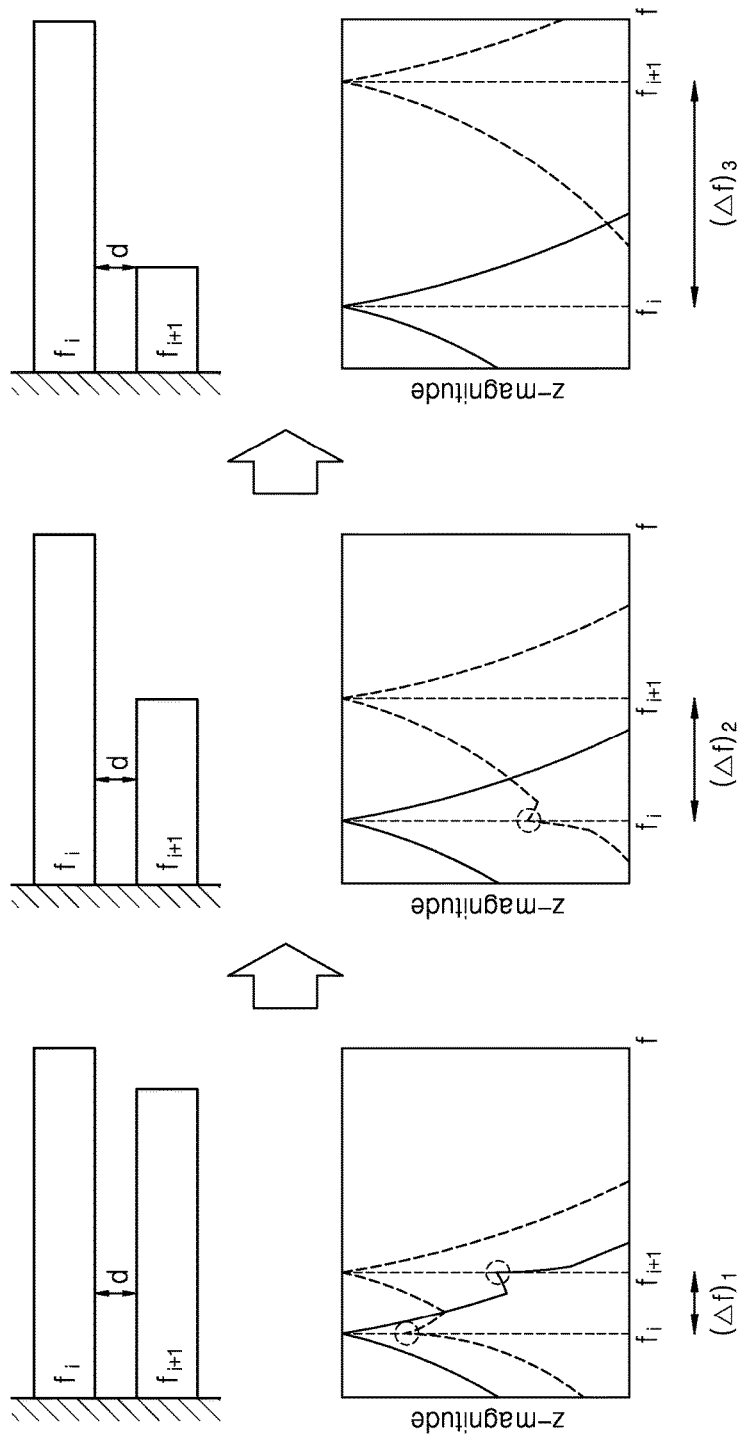
FIG. 5 conceptually illustrates a change of a coupling effect according to a center frequency difference between resonators arranged spatially adjacent to each other.

FIG. 5 conceptually illustrates a change of the coupling effect according to the center frequency difference between the resonators arranged spatially adjacent to each other.

Specifically, FIG. 5 shows frequency response characteristics due to two resonators in three cases in which a spatial separation distance is d and center frequency differences are $(\Delta f)_1$, $(\Delta f)_2$, and $(\Delta f)_3$.

Referring to FIG. 5, as the center frequency difference becomes smaller, stronger coupling occurs. When the center frequency difference is $(\Delta f)_1$, the resonator having a center frequency of $f_i$ also exhibits a peak in response to a frequency of $f_{i-1}$, and the resonator having a center frequency of $f_{i+1}$ also exhibits a peak in response to the frequency of $f_i$.

When the center frequency difference increases to $(\Delta f)_2$, the resonator having the center frequency of $f_i$ does not exhibit a peak in response to the frequency of $f_{i+1}$, but the resonator having the center frequency of $f_{i+1}$ exhibits a peak in response to the frequency of $f_i$.

When the center frequency difference further increases to $(\Delta)_3$, the resonator having the center frequency of $f_i$ does not exhibit a peak in response to the frequency of $f_{i+1}$, and the resonator having the center frequency of $f_{i+1}$ does not exhibit a peak in response to the frequency of $f_i$. That is, coupling between the two resonators does not occur.

From these analyses, it can be seen that coupling can be reduced in such a way that the center frequency difference between the resonators arranged spatially adjacent to each other is set to be a certain value or greater, for example, the center frequency difference therebetween is set to be greater than a bandwidth of each of the resonators.

Figure 6:
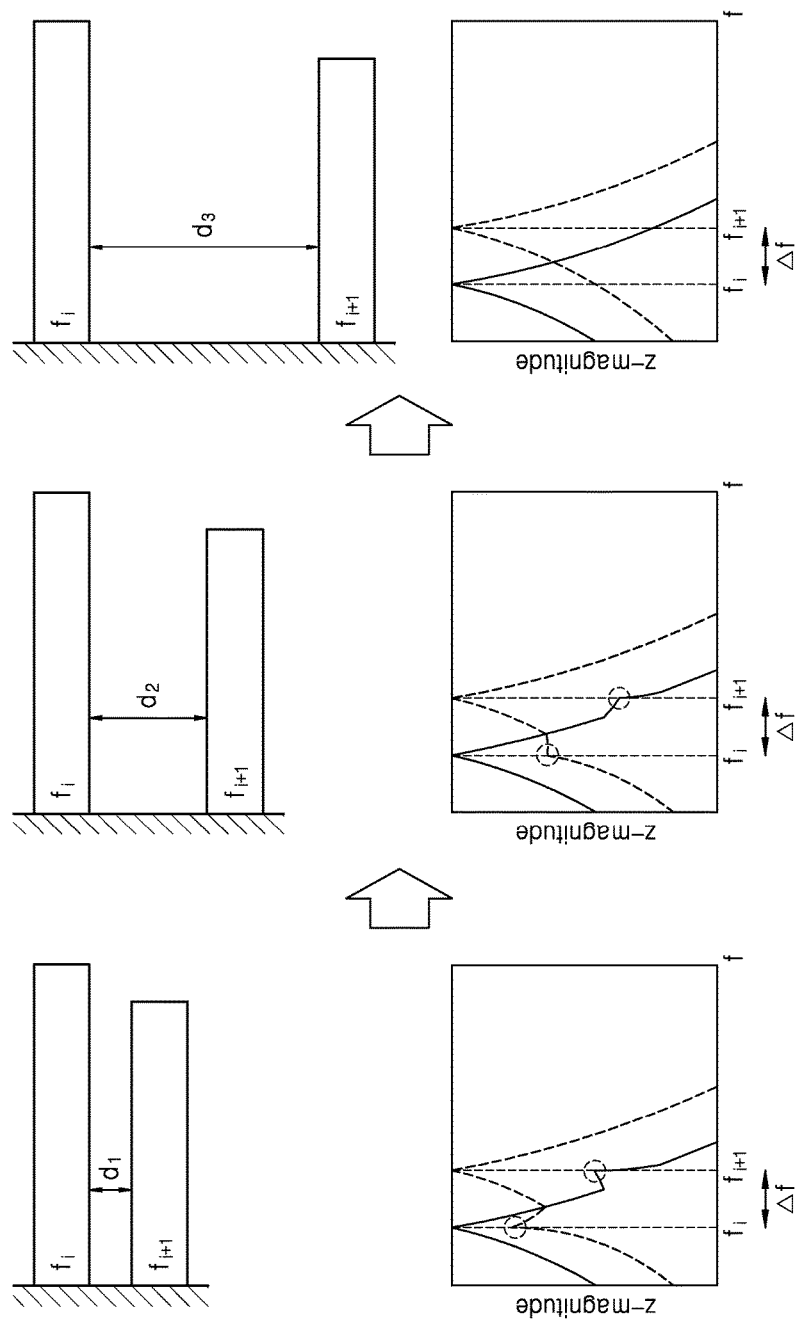
FIG. 6 conceptually illustrates a change of a coupling effect according to a separation distance between resonators, whose center frequencies are adjacent to each other.

FIG. 6 conceptually illustrates a change of the coupling effect according to the separation distance between resonators, whose the center frequencies are adjacent to each other.

Specifically, FIG. 6 shows frequency response characteristics due to two resonators in three cases in which a separation distance between two resonators having a center frequency difference of $\Delta f$ increases to $d_1$, $d_2$, and $d_3$.

Referring to FIG. 6, as the separation distance between the resonators becomes shorter, greater coupling occurs. When the separation distance between the two resonators is $d_1$, the resonator having a center frequency of $f_i$ also exhibits a peak in response to a frequency of $f_{i+1}$, and the resonator having a center frequency of $f_{i+1}$ also exhibits a peak in response to the frequency of $f_i$.

In a case where the separation distance between the two resonators increases to $d_2$, a magnitude of a peak obtained when the resonator having the center frequency of $f_i$ responds to the frequency of $f_{i+1}$ and a magnitude of a peak obtained when the resonator having the center frequency of $f_{i+1}$ responds to the frequency of $f_i$ are smaller than those in a case where the separation distance between the two resonators is $d_1$.

In a case where the center frequency difference further increases to $d_3$, the resonator having the center frequency of $f_i$ does not exhibit a peak in response to the frequency of $f_{i+1}$, and the resonator having the center frequency of $f_{i+1}$ does not exhibit a peak in response to the frequency of $f_i$. That is, coupling between the two resonators does not occur.

From these analyses, it can be seen that coupling can be reduced in such a way that the spatial separation distance between the resonators having a small center frequency difference is set to be a certain value or greater.

By taking this into account, the arrangement of the resonators R of the resonator array 120 in the spectrum analyzer 100 of FIG. 1 may be modified to reduce coupling.

For example, the plurality of resonators R may be arranged so that the separation distance between two resonators R having center frequencies immediately adjacent to each other is greater than the shortest separation distance among the separation distances between the plurality of resonators R.

Alternatively, the plurality of resonators R may be arranged so that the separation distance between two resonators R having center frequencies immediately adjacent to each other is greater than a predetermined value.

Alternatively, the plurality of resonators R may be arranged so that the center frequency difference between two resonators R spatially immediately adjacent to each other is greater than the smallest center frequency difference among the center frequency differences between the plurality of resonators R.

Figure 7:
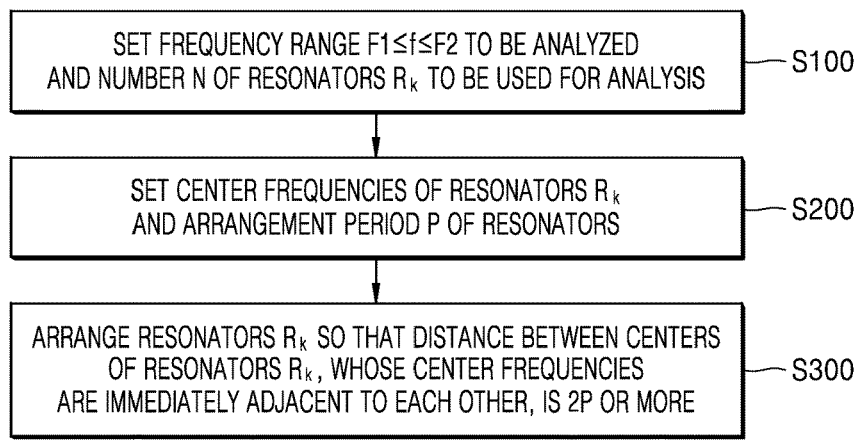
FIGS. 7 and 8 are flowcharts of a method of arranging resonators, according to an embodiment.
Figure 8:
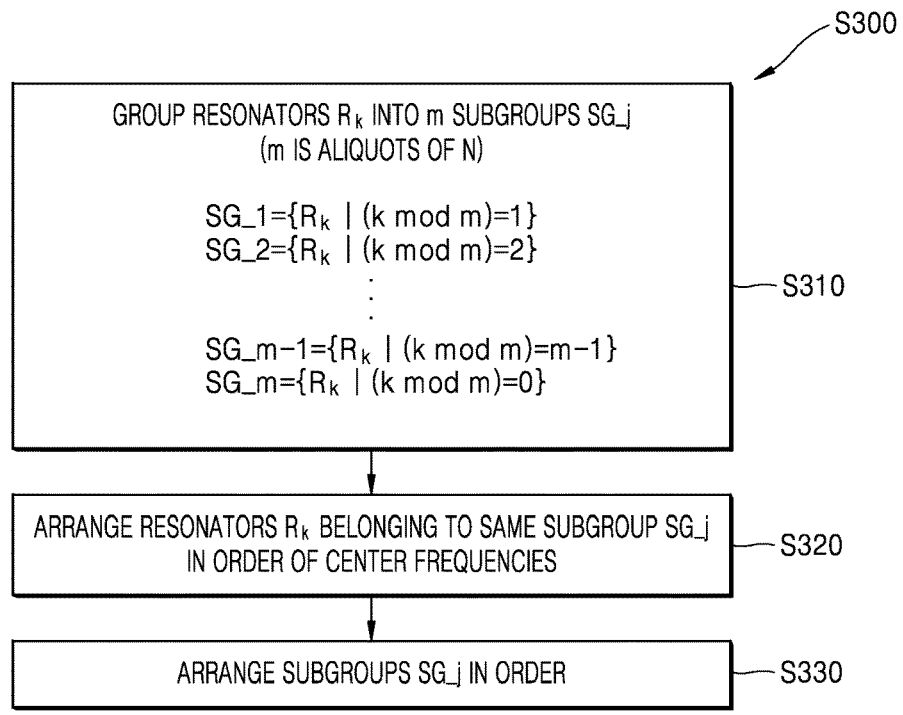

FIGS. 7 and 8 are flowcharts of a method of arranging resonators of a spectrum analyzer, according to an exemplary embodiment.

Referring to FIG. 7, a frequency (f) range $F1 \leq f \leq F2$ and a number N of a plurality of resonators $R_k$ (where k is a natural number from 1 to N) are set for analysis (operation S100).

Center frequencies of the plurality of resonators and an arrangement period p of the plurality of resonators $R_k$ are set (operation S200). The arrangement period p is a distance between centers of adjacent resonators and is a value corresponding to d+w when the separation distance is d. The distance between the centers of the resonators ($R_k$) may be also referred to as a pitch. The center frequencies of the plurality of resonators $R_k$ are set to be different values within the set frequency range F1≤f≤F2. The index k naming the plurality of resonators $R_k$ may be determined in descending order of the center frequencies. The rule for setting the center frequencies may be variously determined. For example, the center frequencies may be set at equal-difference intervals or equal-ratio intervals. Alternatively, the center frequencies may be at arbitrary intervals. For example, the center frequencies may be set densely in a specific frequency section and may be set sparsely in the other frequency sections.

The plurality of resonators $R_k$, whose center frequencies are designed, are arranged in a particular manner. In order to prevent occurrence of coupling, the plurality of resonators $R_k$ are arranged so that a distance between centers of resonators $R_k$, of which the center frequencies are immediately adjacent to each other, is 2p or greater (operation S300).

Alternatively or additionally, the plurality of resonators $R_k$ may be arranged so that a center frequency difference between the resonators $R_k$ spatially immediately adjacent to each other is a certain value or greater.

For example, when the center frequencies of the plurality of resonators $R_k$ are set at equal-difference intervals, that is, when the center frequencies of the plurality of resonators $R_k$ are respectively F1+(k−1)(F2−F1)/(N−1) (where k is a natural number from 1 to N), the plurality of resonators $R_k$ may be arranged so that the center frequency difference between the resonators $R_k$ spatially immediately adjacent to each other is 2(F2−F1)/N or greater.

Alternatively, when the center frequencies of the plurality of resonators $R_k$ are set at equal-ratio (r) intervals, that is, ratio of center frequencies of the two resonators having center frequencies immediately adjacent to each other, among of the plurality of resonators $R_k$, are set to have a constant value r, the plurality of resonators $R_k$ may be arranged so that a center frequency ratio between the resonators $R_k$ spatially adjacent to each other is 2r or greater.

As described above with reference to FIGS. 5 and 6, such arrangements of the resonators $R_k$ are done for increasing the interval between the resonators $R_k$, of which the center frequencies are immediately adjacent to each other, as much as possible and/or increasing the center frequency difference between the resonators $R_k$ spatially immediately adjacent to each other. That is, the optimal combination of the two requirements or the resonator arrangement focusing on either of the two requirements may be selectively used.

A method of grouping the plurality of resonators $R_k$ into subgroups will be described with reference to FIG. 8.

The plurality of resonators $R_k$ may be grouped into m subgroups SG_j (where j is a natural number from 1 to m) (operation S310). In particular, the plurality of resonators $R_k$ may be grouped based on the modulus of m.

The subgroups SG_j may be defined by a remainder obtained when k indicating the center frequency order of the resonators $R_k$ is divided by the number m of subgroups. That is, SG_j (j≠m) includes resonators $R_k$ satisfying (k mod m)=j, and SG_j (j=m) includes resonators $R_k$ satisfying (k mod m)=0.

The number m of subgroups may be aliquots of N, and may be any one of the aliquots of N other than 1 and N. When m is the aliquot of N, the same number of resonators may be included in each subgroup. However, m is not necessarily limited to the aliquot of N.

The resonators $R_k$ belonging to the same subgroup SG_j are arranged adjacent to each other in order of the center frequencies (operation S320). Also, the subgroups SG_j may be arranged in order of the index j defining the subgroups (operation S330).

FIGS. 9A to 9E illustrate resonator arrangement examples when the number of resonators is 12 and the number of subgroups is 1, 2, 3, 4, and 6, respectively.

Figure 9A:
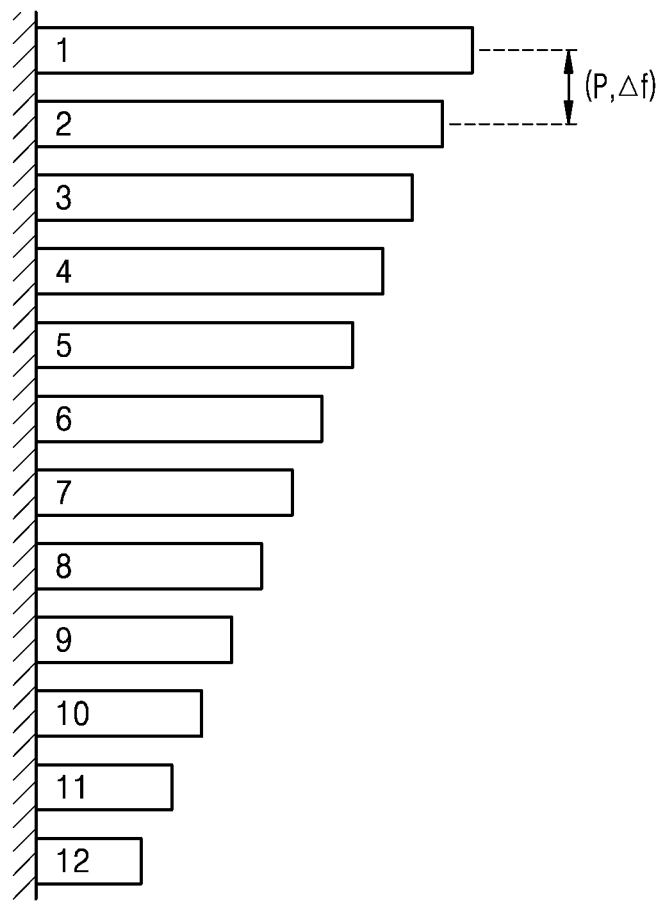
FIGS. 9A, 9B, 9C, 9D, and 9E illustrate resonator arrangement examples when the number of resonators is 12 and the number of subgroups is 1, 2, 3, 4, and 6, respectively.

FIG. 9A illustrates an example in which the number of subgroups is 1, that is, a plurality of resonators are arranged in order of center frequencies without being grouped. In this arrangement, a center frequency difference between the resonators spatially adjacent to each other is smallest. That is, the resonators have a constant arrangement period p, and a center frequency spacing between the adjacent resonators is Δf.

Δf may be differently defined according to a method of setting the center frequencies of the resonators. For example, when the center frequencies are set at equal-difference intervals, Δf is defined as (F2−F1)/N. When the center frequencies are set at equal-ratio (r) intervals, Δf is defined as r.

Figure 9B:
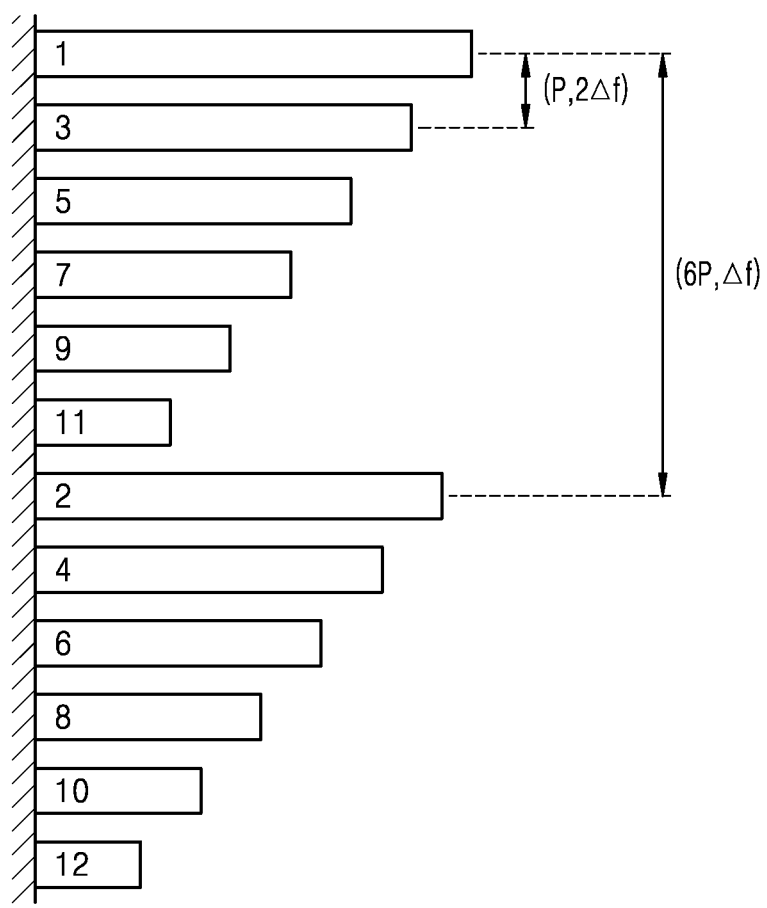

FIG. 9B illustrates a case where two subgroups SG_1 and SG_2 are formed. The subgroup SG_1 includes resonators $R_k$ (k=1, 3, 5, 7, 9, 11) and the subgroup SG_2 includes resonators $R_k$ (k=2, 4, 6, 8, 10, 12). The resonators $R_k$ in the subgroups SG_1 and SG_2 are arranged in order of the center frequencies. In this case, a frequency distance between the resonators $R_1$ and $R_3$ spatially immediately adjacent to each other is 2Δf, and a spatial distance between the resonators $R_1$ and $R_2$, of which the center frequencies are immediately adjacent to each other, is 6p.

Figure 9C:
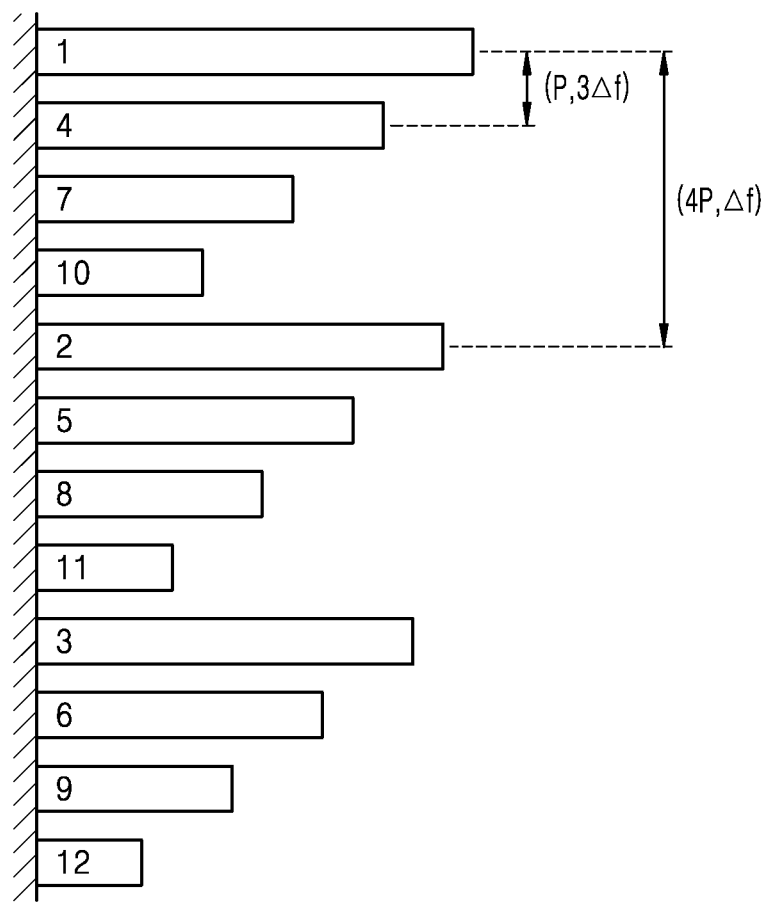

FIG. 9C illustrates a case where three subgroups SG_1, SG_2, and SG_3 are formed. The subgroup SG_1 includes resonators $R_k$ (k=1, 4, 7, 10), the subgroup SG_2 includes resonators $R_k$ (k=2, 5, 8, 11), and the subgroup SG_3 includes resonators $R_k$ (k=3, 6, 9, 12). The resonators $R_k$ in the subgroups SG_1, SG_2, and SG_3 are arranged in order of the center frequencies. In this case, a frequency distance between the resonators $R_1$ and $R_4$ spatially immediately adjacent to each other is 3Δf, and a spatial distance between the resonators $R_1$ and $R_2$, of which the center frequencies are immediately adjacent to each other, is 4p.

Figure 9D:
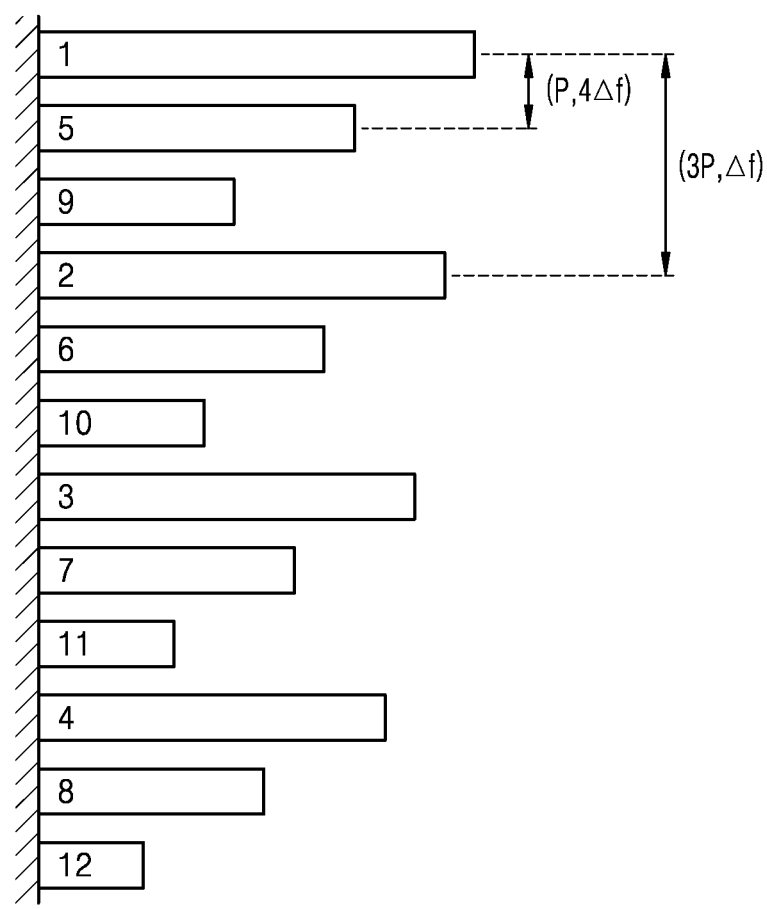

FIG. 9D illustrates a case where four subgroups SG_1, SG_2, SG_3, and SG_4 are formed. The subgroup SG_1 includes resonators $R_k$ (k=1, 5, 9), the subgroup SG_2 includes resonators $R_k$ (k=2, 6, 10), the subgroup SG_3 includes resonators $R_k$ (k=3, 7, 11), and the subgroup SG_4 includes resonators $R_k$ (k=4, 8, 12). The resonators $R_k$ in the subgroups SG_1, SG_2, SG_3, and SG_4 are arranged in order of the center frequencies. In this case, a frequency distance between the resonators $R_1$ and $R_5$ spatially immediately adjacent to each other is 4Δf, and a spatial distance between the resonators $R_1$ and $R_2$, of which the center frequencies are immediately adjacent to each other, is 3p.

Figure 9E:
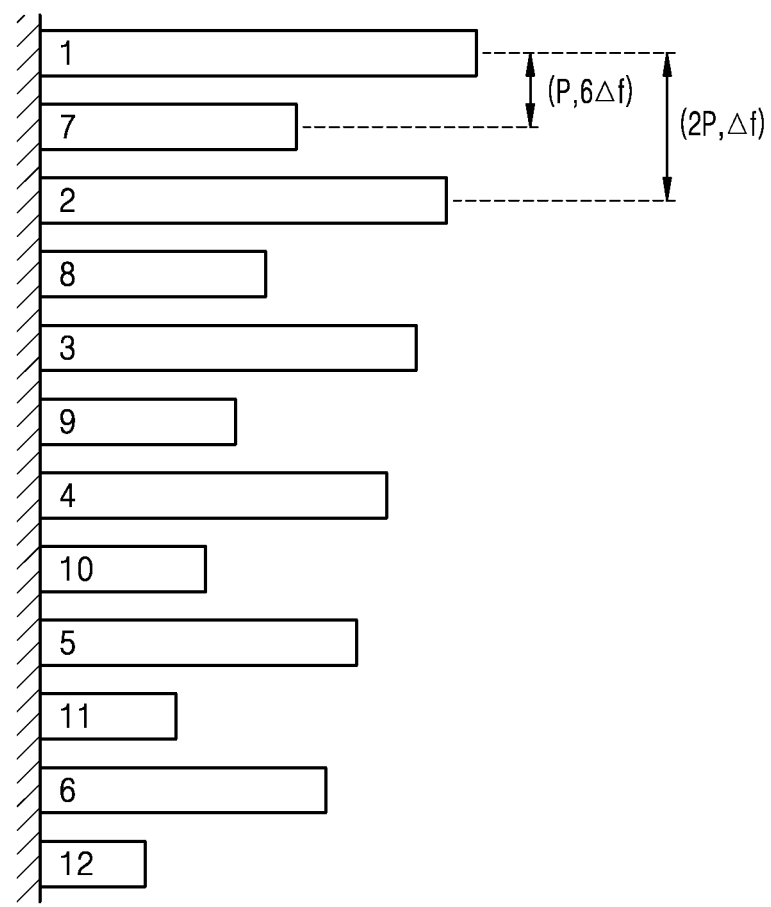

FIG. 9E illustrates a case where six subgroups are formed. In this case, a frequency distance between the resonators $R_1$ and $R_7$ spatially immediately adjacent to each other is 6Δf, and a spatial distance between the resonators $R_1$ and $R_2$, of which the center frequencies are immediately adjacent to each other, is 2p.

As described above, the number of subgroups may be variously selected through an appropriate combination of aspects of securing the distance between the resonators, of which the center frequencies are adjacent to each other, or securing the center frequency difference between the resonators spatially adjacent to each other. The case of FIG. 9B further focuses on the aspect of securing the distance between the resonators, of which the center frequencies are adjacent to each other, and the case of FIG. 9E further focuses on the aspect of securing the center frequency difference between the resonators spatially adjacent to each other.

In order to appropriately combine the two aspects, the number m of subgroups may be determined to be a median value when the aliquots of N are sequentially arranged. For example, when the aliquots of N are sequentially arranged, one medium value or two median values may be determined as the number of subgroups.

When the resonators are grouped into subgroups as described above, it is possible to reduce coupling between the resonators, and if necessary, it is possible to drive only some subgroups. Since the frequency band ranges covered by the respective subgroups are similar to one another, it is possible to achieve power-saving driving by driving only some subgroups, although a resolution is slightly sacrificed.

Figure 10:
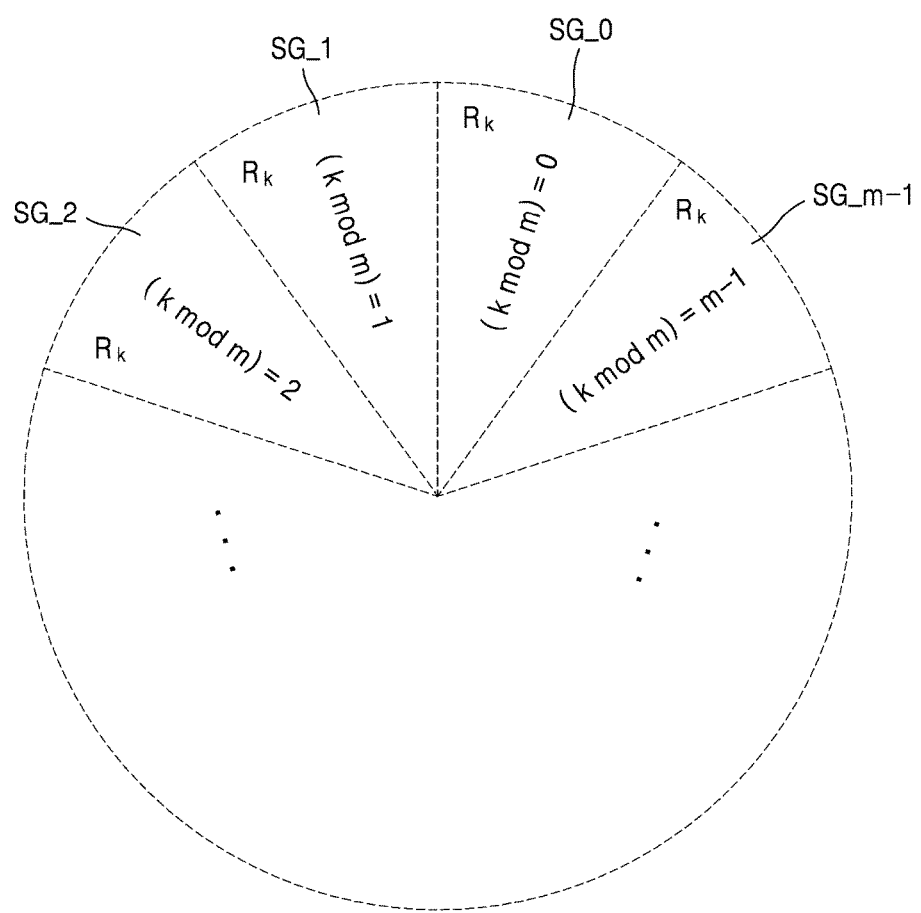
FIG. 10 illustrates an example in which a plurality of resonators are divided into m subgroups that are arranged in a circular shape.
Figure 11:
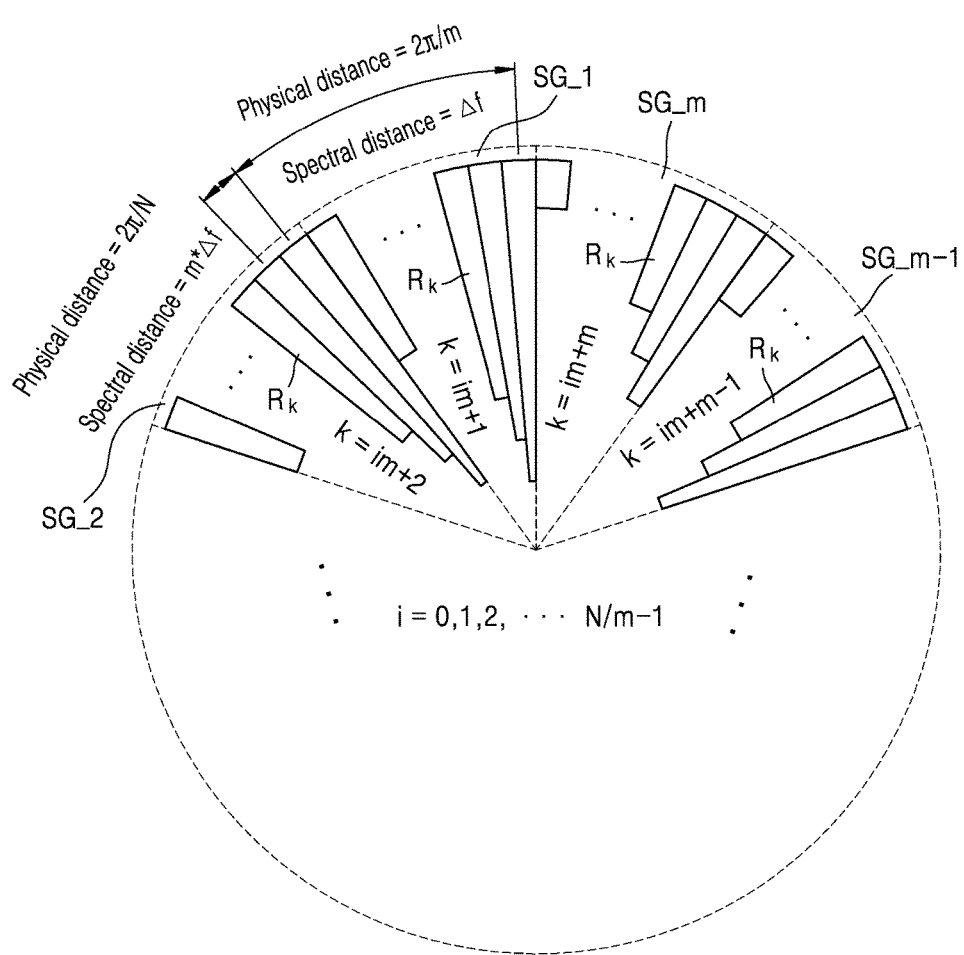
FIG. 11 illustrates an example in which resonators are arranged in order of center frequencies in each subgroup of FIG. 10.

FIG. 10 illustrates an example in which a plurality of resonators $R_k$ are divided into m subgroups that are arranged in a circular shape, and FIG. 11 illustrates an example in which resonators are arranged in each subgroup of FIG. 10.

The plurality of subgroups SG_j (where j is a natural number from 1 to m) includes a group of resonators $R_k$ having the same remainder when the index k naming the resonators $R_k$ is divided by m. The plurality of subgroups SG_j may occupy a fan-shaped area and be sequentially arranged along a circumferential direction.

In each subgroup SG_j, the resonators $R_k$ are arranged along the circumferential direction in order of the center frequencies. The resonators $R_k$ in each subgroup SG_j satisfy k=i*m+j (where i is an integer from 0 to (N/m)−1). A frequency distance between two resonators spatially adjacent to each other, that is, two resonators (e.g., $R_2$ and $R_{m+2}$), of which an angular distance is 2π/N radians, is m*Δf. Δf is a frequency distance value determined according to a method of setting the center frequencies of the resonators $R_k$. As described above, Δf corresponds to a common distance when the resonators $R_k$ are arranged at equal-difference intervals, and corresponds to a common ratio when the resonators $R_k$ are arranged at equal-ratio intervals. A physical distance between two resonators, of which the center frequencies are adjacent to each other, that is, two resonators (e.g., $R_1$ and $R_2$, or $R_{m+1}$ and $R_{m+2}$) having a center frequency distance of Δf, is an angular distance of 2π/m radians.

Figure 12:
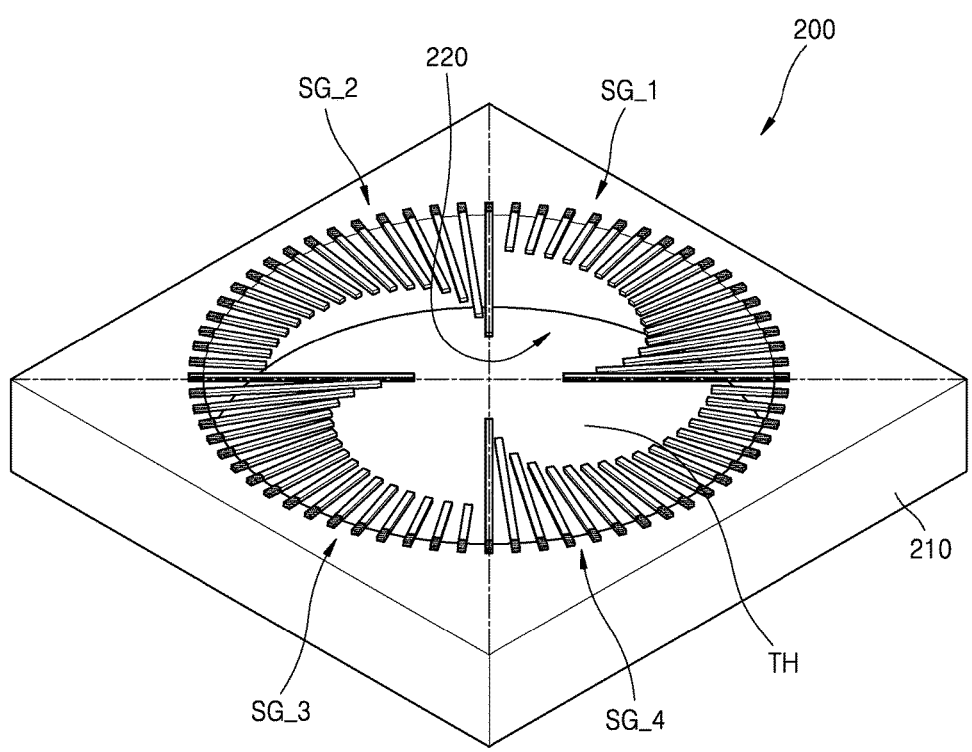
FIG. 12 is a perspective view illustrating a schematic configuration of a spectrum analyzer according to another exemplary embodiment.

FIG. 12 is a perspective view illustrating a schematic configuration of a spectrum analyzer 200 according to another exemplary embodiment.

The spectrum analyzer 200 includes a support substrate 210 with a through-hole TH, and a resonator array 220. The resonator array 220 includes four subgroups SG_1, SG_2, SG_3, and SG_4 arranged according to the above-described arranging method. An arrangement trajectory of fixing portions of the resonators R has a circular shape.

Figure 13:
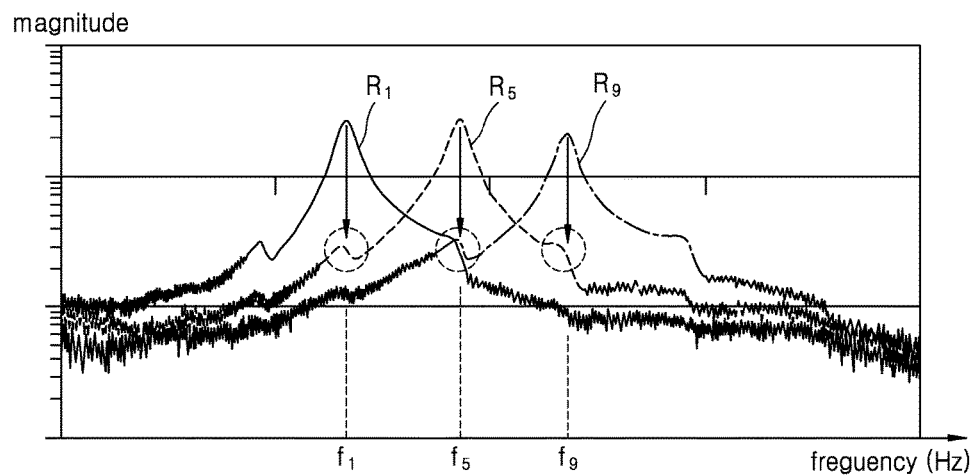
FIG. 13 is a graph showing frequency response characteristics due to three resonators arranged spatially adjacent to one another in the spectrum analyzer of FIG. 12.

FIG. 13 is a graph showing frequency response characteristics due to three resonators arranged spatially adjacent to one another in the spectrum analyzer 200 of FIG. 12.

Resonators $R_1$, $R_5$, and $R_9$ belong to the same subgroup SG_1 and a center frequency distance between adjacent subgroups (e.g., SG_1 and SG_2) is 4Δf. Although the resonators $R_1$, $R_5$, and $R_9$ are arranged most adjacent to each other, coupling occurs very weakly because the center frequency distance is secured.

Figure 14:
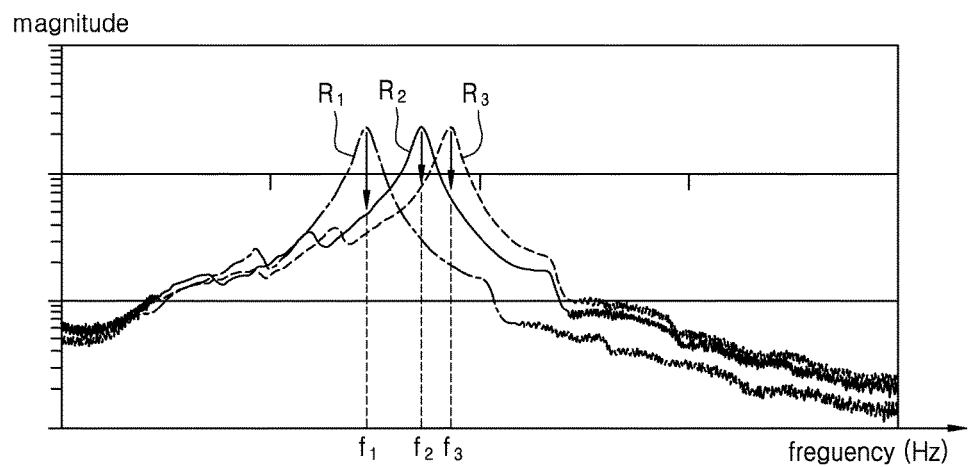
FIG. 14 is a graph showing frequency response characteristics due to three resonators, whose center frequencies are adjacent to one another, in the spectrum analyzer of FIG. 12.

FIG. 14 is a graph showing frequency response characteristics due to three resonators, whose center frequencies are close to one another, in the spectrum analyzer 200 of FIG. 12.

Resonators $R_1$, $R_2$, and $R_3$ respectively belong to subgroups SG_1, SG_2, and subgroup SG_3 and have an angular distance of 2π/4 radians. Although the center frequency distance is Δf, that is, the center frequency distance is most adjacent, coupling does not almost occur because the spatial separation distance is secured.

Figure 15:
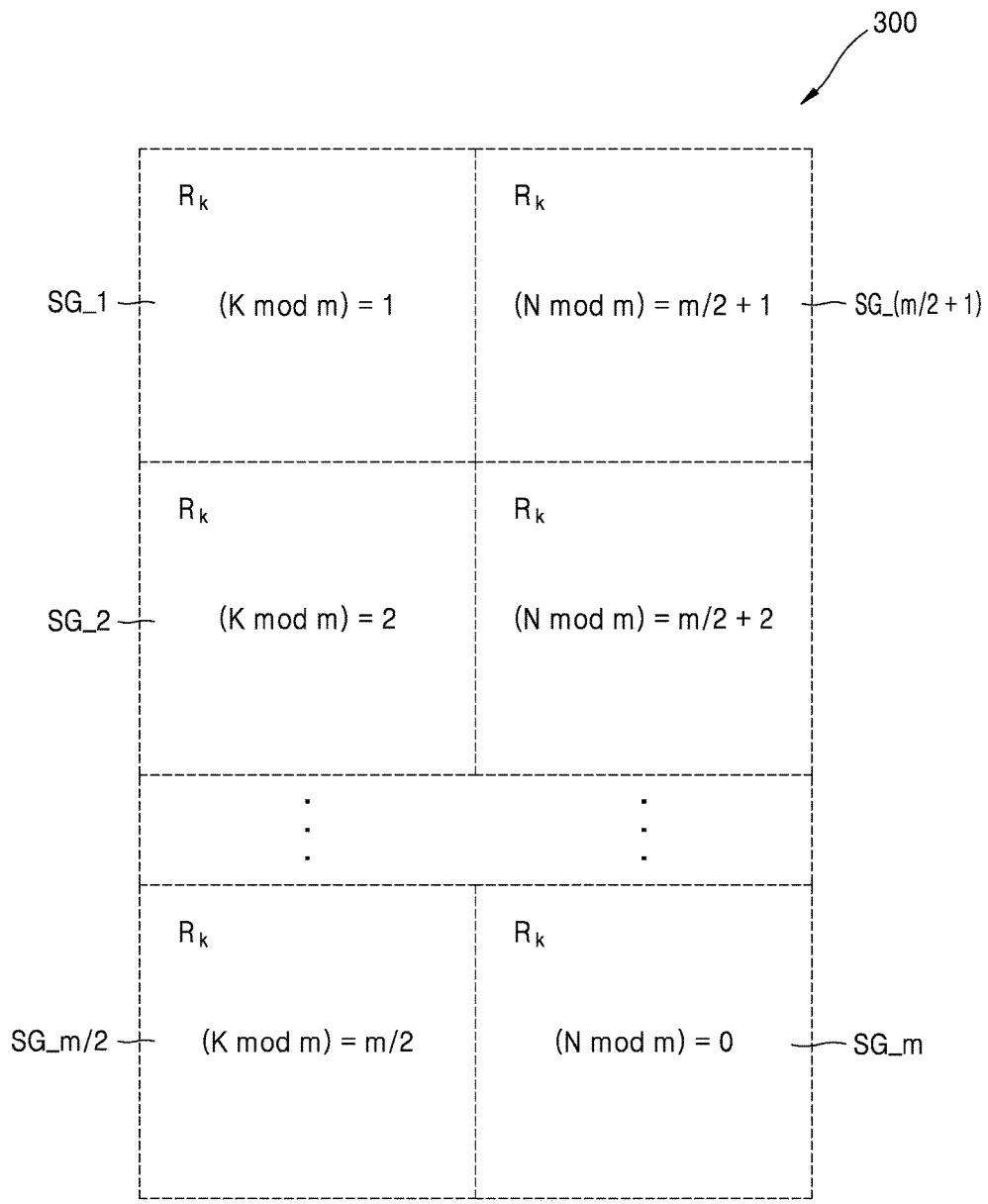
FIG. 15 illustrates an example in which a plurality of resonators are divided into m subgroups arranged in a rectangular shape in a spectrum analyzer according to another exemplary embodiment.
Figure 16:
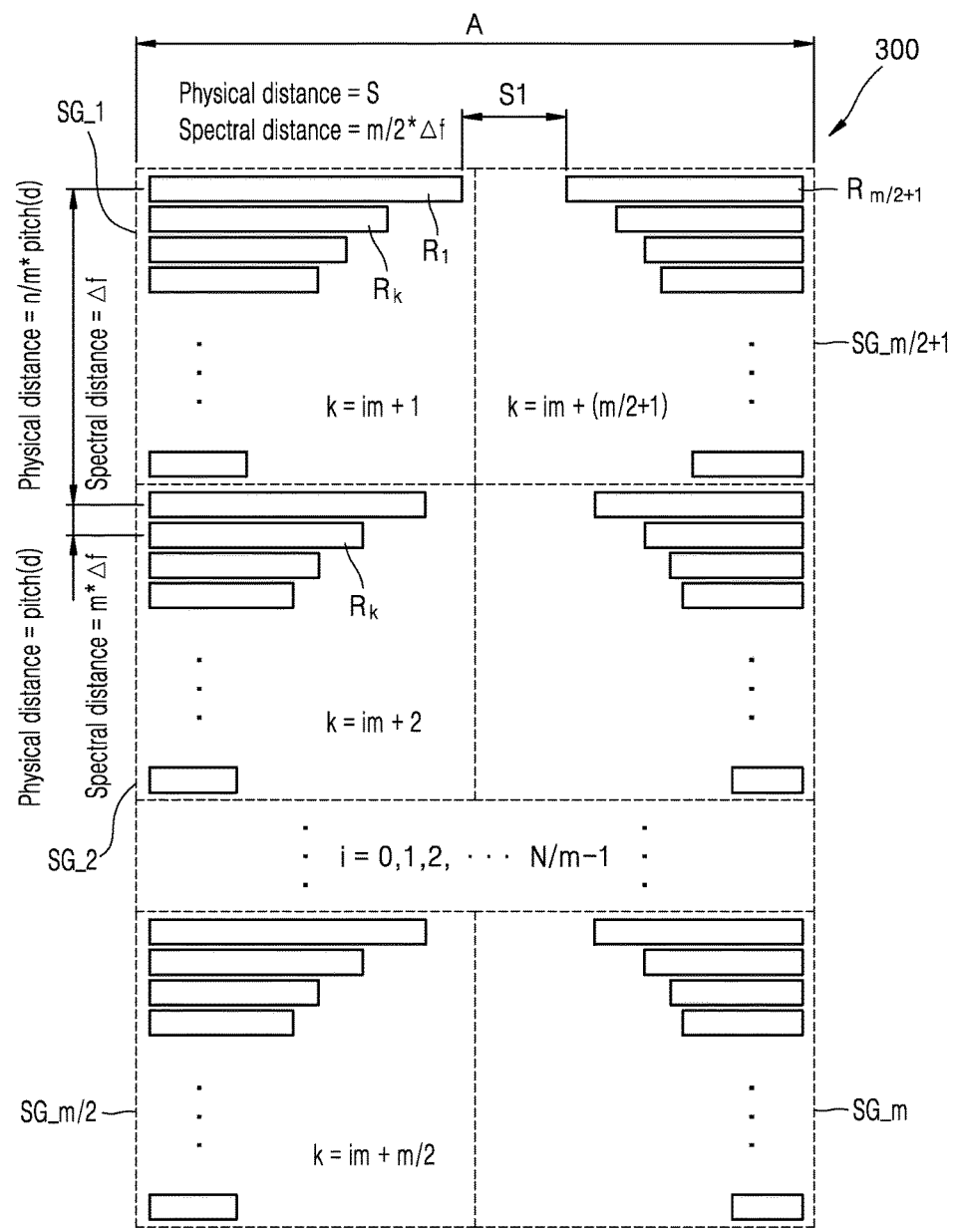
FIG. 16 illustrates an example in which resonators are arranged in order of center frequencies in each subgroup of FIG. 15.

FIG. 15 illustrates an example in which a plurality of resonators $R_k$ are divided into m subgroups SG_j (where j is a natural number from 1 to m) arranged in a rectangular shape in a spectrum analyzer 300 according to another exemplary embodiment, and FIG. 16 illustrates an example in which the resonators $R_k$ are arranged in order of center frequencies in each subgroup SG_j of FIG. 15. N denotes the total number of the plurality of resonators $R_k$.

The number m of subgroups SG_j may be set to be even number. The subgroups SG_1 to SG_m/2 are sequentially arranged vertically along one side of the rectangular shape, and the subgroups SG_(m/2)+1 to m are sequentially arranged vertically along the other side of the rectangular shape.

This arrangement may be applied to the support substrate with a rectangular through-hole. That is, fixing portions of the plurality of resonators may be arranged along two parallel sides of the rectangular shape. In other words, an arrangement trajectory of the fixing portions of the resonators belonging to the subgroups SG_1 to SG_m/2 may have a shape of a first straight line, and an arrangement trajectory of the fixing portions of the resonators belonging to the subgroups SG_(m/2)+1 to SG_m may have a shape of a second straight line parallel to the first straight line.

The resonators $R_k$ in each subgroup SG_j satisfy k=i*m+j (where i is an integer from 0 to (N/m)−1). In each subgroup SG_j, the resonators $R_k$ are arranged in order of the k values, and the resonators belonging to different subgroups and facing one another have the same magnitude order in the corresponding subgroups. For example, the resonators $R_1$ and $R_{(m/2)+1}$ face each other, and the resonators $R_{m+1}$ and $R_{(3m/2)+1}$ face each other. As illustrated in FIG. 16, the shortest separation distance among the separation distances between the resonators belonging to different subgroups and facing one another is S1. A horizontal length A of the rectangular shape may be set based on the S1 value.

Figure 17:
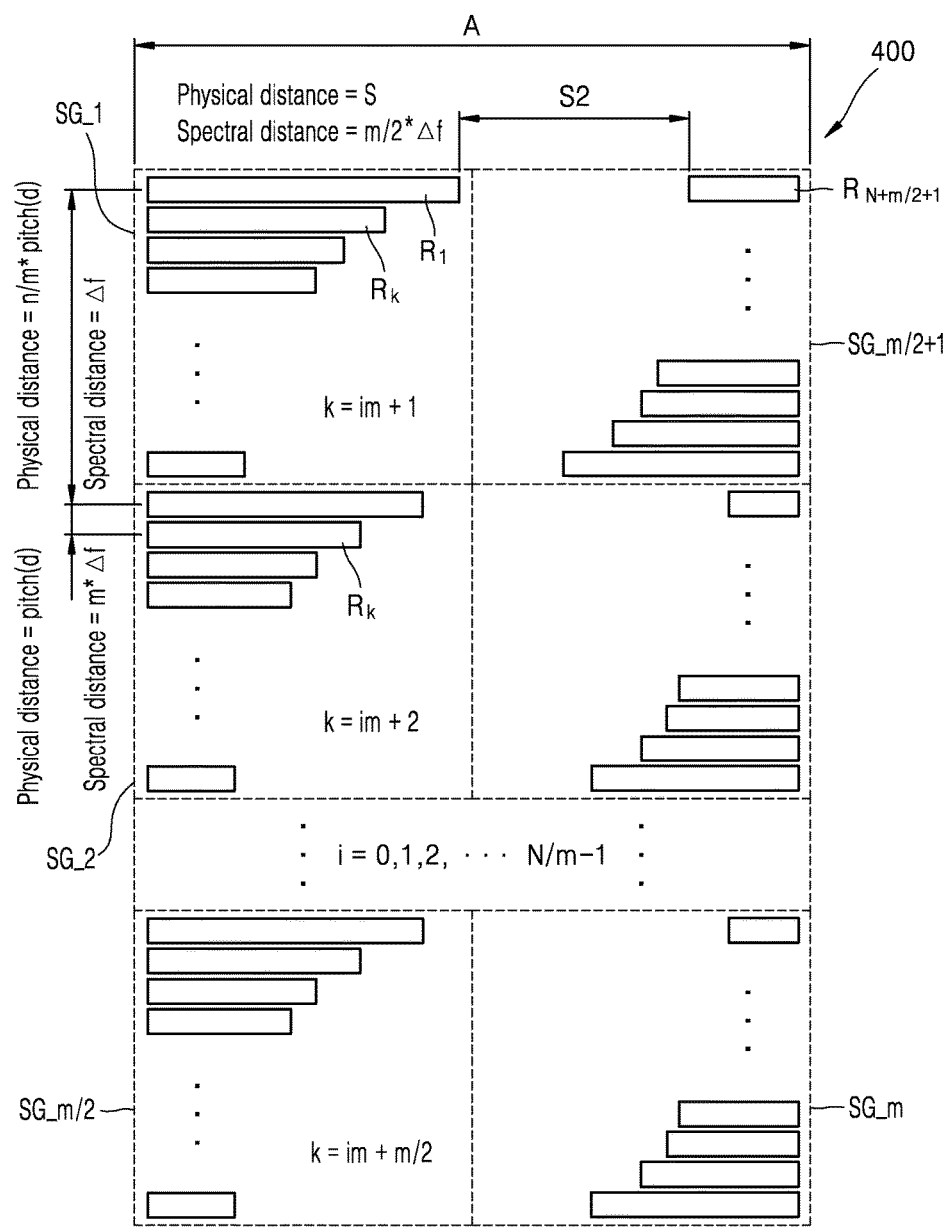
FIG. 17 illustrates an example in which resonators of subgroups facing each other are arranged in reverse order of center frequencies.

FIG. 17 illustrates arrangement of resonators used in a spectrum analyzer 400 according to a modification of FIG. 16.

Subgroups SG_j of the spectrum analyzer 400 are arranged in the same manner as those of the spectrum analyzers 300 of FIGS. 15 and 16. However, the order of center frequencies of the resonators of the subgroups SG_j facing one another is opposite to that in FIG. 16.

The resonators $R_k$ in each subgroup SG_j satisfy k=i*m+j (where i is an integer from 0 to (N/m)−1). The resonators Rx in the subgroups SG_1 to SG_m/2 are arranged in ascending order of the k values, and the resonators $R_k$ in the subgroups SG_(m/2)+1 to m are arranged in descending order of the k values. That is, the resonator $R_1$ having the smallest k value in the subgroup SG_1 faces the resonator $R_{(N+m)/2+1}$ having the largest k value in the subgroup SG_(m/2)+1.

Due to such an arrangement, an area occupied by the resonators $R_k$ may be further reduced than that in the case of FIG. 16, thereby implementing a more compact structure. The shortest separation distance among the separation distances between the resonators belonging to different subgroups and facing one another is S2. When the horizontal length of the rectangular shape is A as in the case of FIG. 16, S2 is greater than S1 illustrated in FIG. 16.

Therefore, in other words, when S2 is set to be S1 as in the case of FIG. 16, a total length of the resonators $R_1$ and $R_{(N+m)/2+1}$ facing each other is less than a total length of the resonators $R_1$ and $R_{(m/2)+1}$ facing each other in FIG. 16. Thus, the horizontal length A of the rectangular shape for the arrangement of the resonators $R_k$ may be set to be less than that in the case of FIG. 16.

Figure 18:
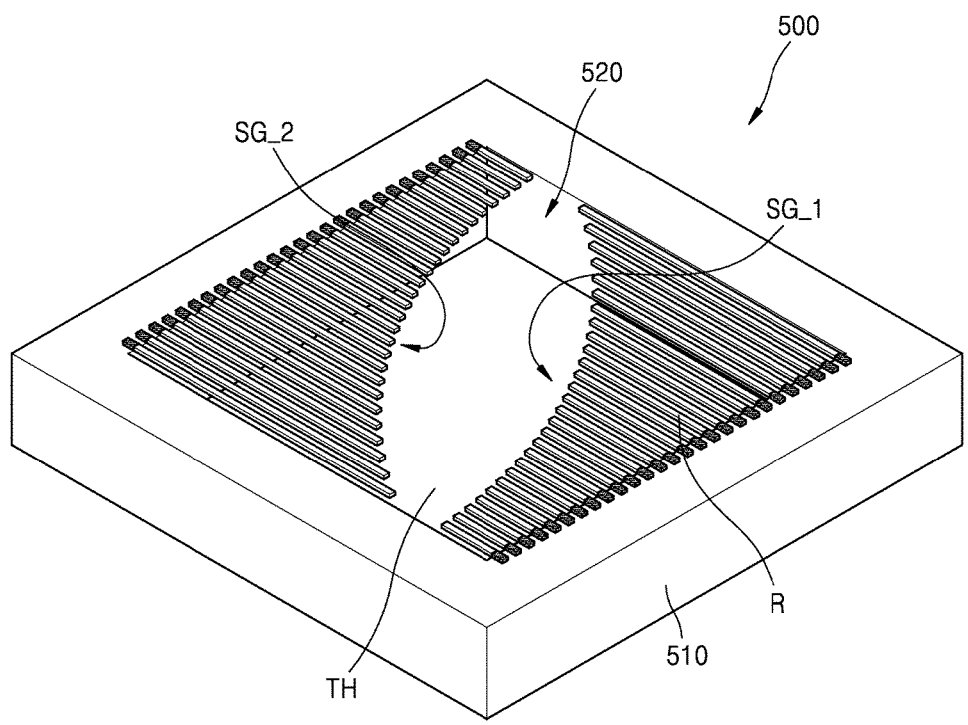
FIG. 18 is a perspective view illustrating a schematic configuration of a spectrum analyzer according to another exemplary embodiment.

FIG. 18 is a perspective view illustrating a schematic configuration of a spectrum analyzer 500 according to another exemplary embodiment.

The spectrum analyzer 500 includes a support substrate 510 with a rectangular through-hole TH, and a resonator array 520. The resonator array 520 includes two subgroups SG_1 and SG_2. An area occupied by the plurality of resonators R may be minimized by reversing the center frequency order of the resonators of the subgroups SG_1 and SG_2 facing each other.

Figure 19:
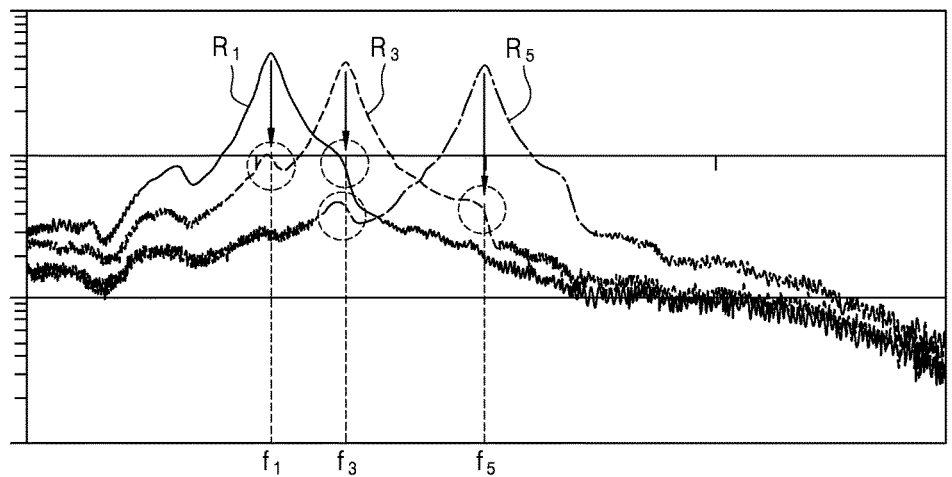
FIG. 19 is a graph showing frequency response characteristics due to three resonators arranged spatially adjacent to one another in the spectrum analyzer of FIG. 18.

FIG. 19 is a graph showing frequency response characteristics due to three resonators $R_1$, $R_3$, and $R_5$ arranged spatially adjacent to one another in the spectrum analyzer 500 of FIG. 18.

The resonators $R_1$, $R_3$, and $R_5$ belong to the same subgroup SG_1 and a center frequency distance thereof is $2\Delta f$. Although the resonators $R_1$, $R_5$, and $R_9$ are arranged most adjacent to each other, coupling occurs very weakly because the center frequency distance is secured.

Figure 20:
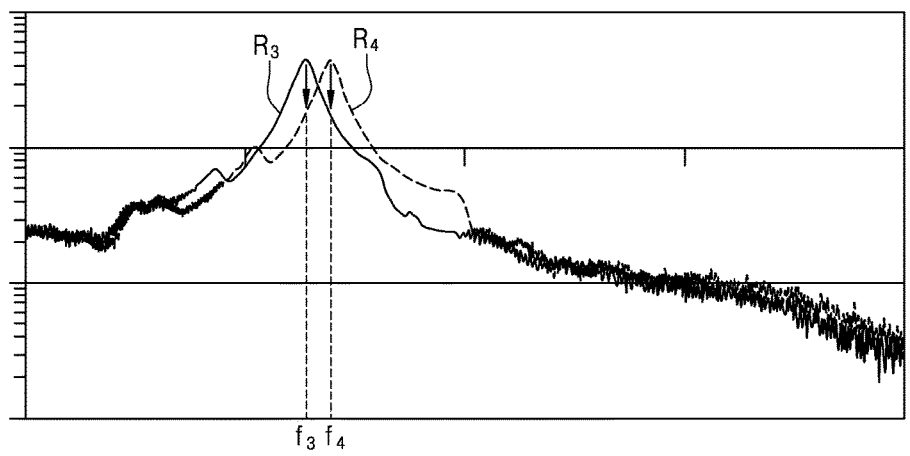
FIG. 20 is a graph showing frequency response characteristics due to two resonators whose center frequencies are adjacent to each other, in the spectrum analyzer of FIG. 18.

FIG. 20 is a graph showing frequency response characteristics due to two resonators, whose center frequencies are adjacent to each other, in the spectrum analyzer 500 of FIG. 18.

The resonators $R_3$ and $R_4$ belong to subgroups SG_1. Although SG_2 and the center frequency distance thereof is $\Delta f$, that is, the center frequency distance is most adjacent, coupling barely occurs because the spatial separation distance is secured.

Figure 21:
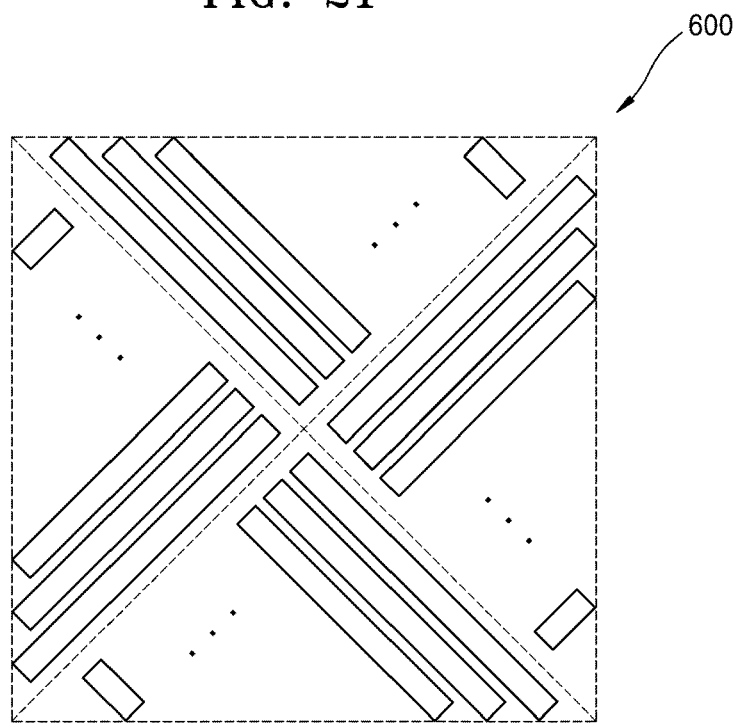
FIG. 21 is a plan view illustrating an example of a resonator arrangement in a spectrum analyzer according to another exemplary embodiment.

FIG. 21 is a plan view illustrating an example of a resonator arrangement in a spectrum analyzer 600 according to another exemplary embodiment.

Resonators R included in the spectrum analyzer 600 are arranged in four subgroups in four regions defined by dividing a square region by two diagonal lines. The resonators R having different lengths may be sequentially arranged in the four regions in a triangular shape.

As illustrated in FIG. 18, the resonators R may be arranged on a support substrate with a rectangular through-hole. However, exemplary embodiments are not limited thereto. For example, the resonators R may be arranged so that fixing portions are fixed on a beam structure having a shape of two diagonal lines.

Figure 22:
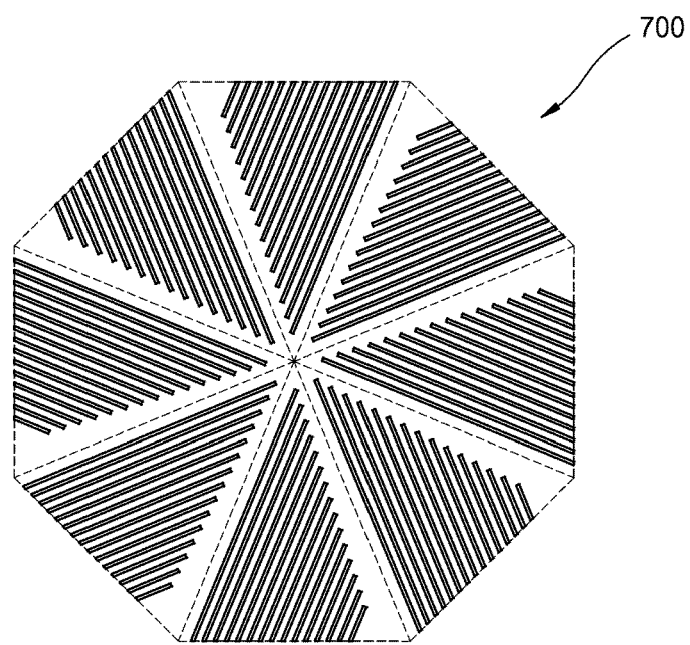
FIG. 22 is a plan view illustrating an example of a resonator arrangement in a spectrum analyzer according to another exemplary embodiment.

FIG. 22 is a plan view illustrating an example of a resonator arrangement in a spectrum analyzer 700 according to another exemplary embodiment.

Resonators R included in the spectrum analyzer 700 are arranged into m subgroups and are arranged in a polygonal region having m sides. The subgroups are allocated in m regions partitioned by diagonal lines, and resonators having different lengths are sequentially arranged in the subgroups. A case where m is 8 is illustrated in FIG. 22, but this is merely an example and embodiments are not limited thereto.

The resonators R may be arranged on a substrate having an m-polygonal through-hole. However, exemplary embodiments are not limited thereto. The resonators R may be arranged in a beam structure having a shape corresponding to diagonal lines of an m-polygon.

Figure 23A:
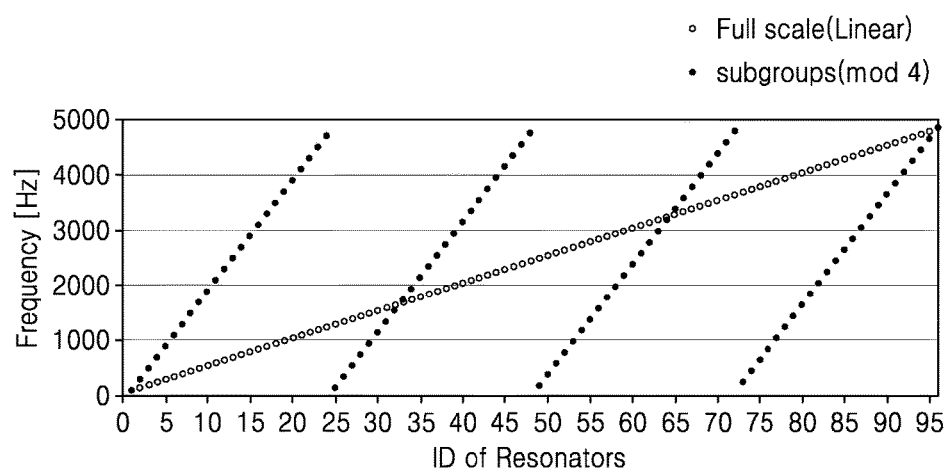
FIGS. 23A, 23B, and 23C are graphs showing examples of methods of setting center frequencies of resonators used in spectrum analyzers according to exemplary embodiments.
Figure 23B:
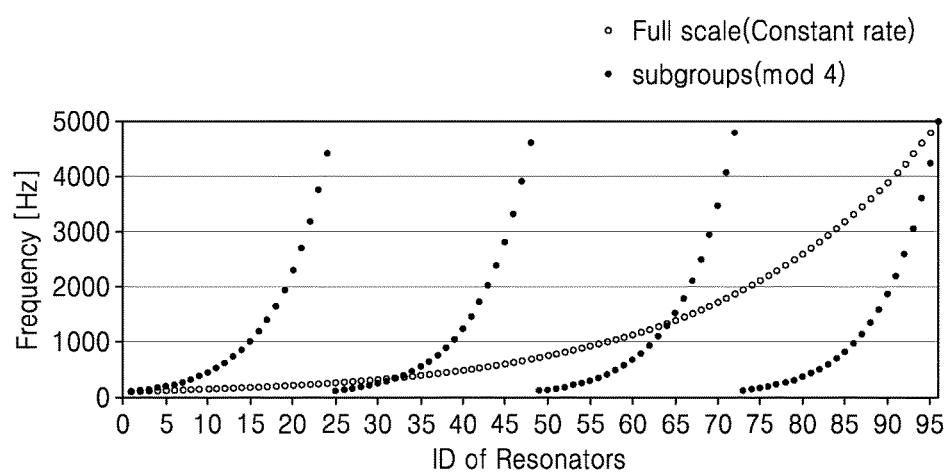
Figure 23C:
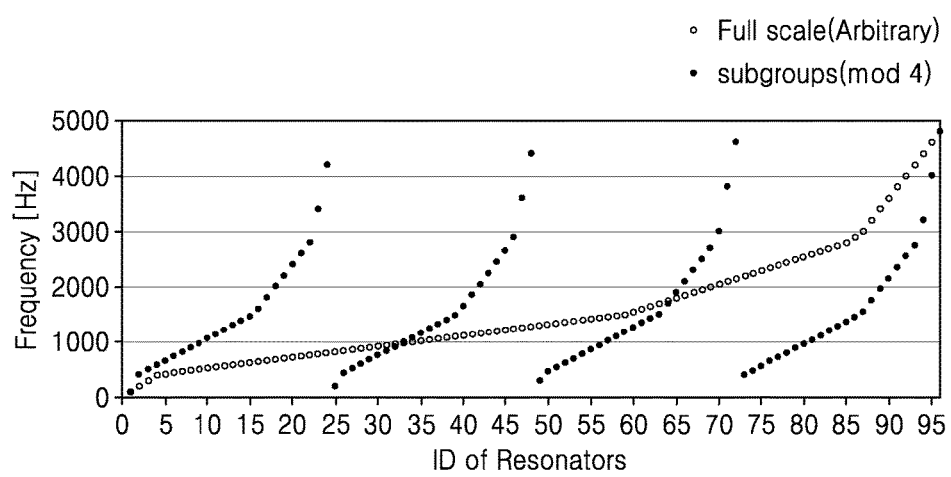

FIGS. 23A to 23C are graphs showing examples of methods of setting center frequencies of resonators used in spectrum analyzers according to exemplary embodiments.

FIG. 23A illustrates an example in which a frequency range to be analyzed is divided by equal-difference intervals. Values divided by the equal-difference intervals are assigned as center frequency values together with identifications (IDs) of a plurality of resonators, and the plurality of resonators are grouped into four subgroups according to the given IDs by the above-described method.

FIG. 23B illustrates an example in which a frequency range to be analyzed is divided by equal-ratio intervals. Frequency values set by the equal-ratio intervals are assigned as center frequency values together with IDs of a plurality of resonators, and the plurality of resonators are grouped into four subgroups according to the given IDs by the above-described method.

FIG. 23C illustrates an example in which a frequency range to be analyzed is divided by arbitrary intervals. The arbitrary intervals may be variously set as a mixture of equal-difference intervals having different common difference values, a mixture of equal-ratio intervals having different common ratio values, or a combination of the equal-difference interval and the equal-ratio interval. The set frequency values are assigned as center frequency values together with IDs of a plurality of resonators, and the plurality of resonators are grouped into four subgroups according to the given IDs by the above-described method.

FIGS. 23A to 23C illustrate the method of setting the center frequencies by dividing the frequency band into the four subgroups, but exemplary embodiments are not limited thereto. It is possible to divide the frequency band into various numbers of subgroups, and the method of setting the center frequencies may be modified by combinations of the above-described methods or other forms.

The resonators having the movable portions driven by a cantilever method have been described above, but exemplary embodiments are not limited thereto. The resonator arrangement methods described above may be applied to various resonators showing a coupling phenomenon due to a frequency-adjacent or space-adjacent structure.

In the spectrum analyzers according to exemplary embodiments, frequencies of a certain band may be selectively sensed by a plurality of resonators having different center frequencies, thereby facilitating frequency information analysis with respect to an input signal.

The spectrum analyzers according to exemplary embodiments need not perform a Fourier transform and may independently improve a frequency resolution and a time resolution.

According to the method of arranging the resonators of the spectrum analyzer, the coupling phenomenon between the resonators may be reduced by securing the spatial separation distance between the resonators having adjacent center frequencies and/or the center frequency distance between the spatially adjacent resonators.

When the resonators are arranged based on the subgrouping method according to the method of arranging the resonators of the spectrum analyzer, coupling between the adjacent resonators may be reduced, thereby improving spectrum analysis accuracy. Also, if necessary, only some subgroups may be selectively driven, thereby achieving a reduction in power consumption.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:
1. A spectrum analyzer comprising:
a support substrate comprising a through-hole; and
a plurality of resonators that have center frequencies different from each other, each of the plurality of resonators comprising a fixing portion that is fixed to the support substrate, and a movable portion that faces the through-hole,
wherein a separation distance between the movable portions of two resonators having immediately adjacent center frequencies, among the center frequencies of the plurality of resonators, is greater than a shortest separation distance among separation distances between the movable portions of the plurality of resonators.
2. The spectrum analyzer of claim 1, wherein each of the plurality of resonators comprises:
a fixing portion fixed to the support substrate; and
a sensor configured to sense a movement of the movable portion.
3. The spectrum analyzer of claim 2, wherein, when N denotes a number of the plurality of resonators, $R_k$ denotes the plurality of resonators in order of center frequencies, k denotes a natural number from 1 to N, m is any one of aliquots of N other than 1 and N, and j is a natural number from 1 to m, the plurality of resonators are grouped into m subgroups SG_j,
when j is different from m, each of the subgroups SG_j includes resonators $R_k$ satisfying (k mod m)=j,
when j is equal to m, each of the subgroups SG_j includes resonators $R_k$ satisfying (k mod m)=0, and
resonators $R_k$ belonging to a same subgroup SG_j are arranged adjacent to each other in order of the center frequencies.
4. The spectrum analyzer of claim 3, wherein the subgroups SG_j are arranged in order of the j values.
5. The spectrum analyzer of claim 4, wherein the fixing portions of the plurality of resonators are arranged to have a trajectory in an m-polygonal shape with m sides.
6. The spectrum analyzer of claim 3, wherein, m is one medium value or two median values of the aliquots of N.
7. The spectrum analyzer of claim 3, wherein m is a natural number greater than 2, and
the fixing portions of the plurality of resonators are arranged to have a trajectory in a polygonal shape, a circular shape, or a closed curve shape.
8. The spectrum analyzer of claim 3, wherein m is an even number, and
the fixing portions of the plurality of resonators are arranged to have a trajectory in a shape of two straight lines parallel to each other.
9. The spectrum analyzer of claim 8, wherein the fixing portions of the resonators belonging to subgroups SG_1 to SG_m/2 among the subgroups SG_j are arranged to have a trajectory in a shape of a first straight line, and
the fixing portions of the resonators belonging to subgroups SG_(m/2)+1 to SG_m among the subgroups SG_j are arranged to have a trajectory in a shape of a second straight line parallel to the first straight line.
10. The spectrum analyzer of claim 8, wherein resonators in a first subgroup of the plurality of resonators and resonators in a second subgroup of the plurality resonators face each other and are arranged in reverse order of the center frequencies.

11. The spectrum analyzer of claim 3, wherein when the center frequencies of the plurality of resonators are within a range between a first frequency F1 and a second frequency F2, the center frequencies of the plurality of resonators are F1+(k−1)(F2−F1)/(N−1), respectively, and
wherein N is a number of the plurality of resonators, and k is a natural number from 1 to N.
12. The spectrum analyzer of claim 3, wherein ratio of center frequencies of the two resonators having center frequencies immediately adjacent to each other, among of the plurality of resonators, are set to have a constant value r.
13. The spectrum analyzer of claim 1, wherein the fixing portions of the plurality of resonators are arranged to have a trajectory along a cross-sectional shape of the through-hole.
14. The spectrum analyzer of claim 1, wherein a cross-sectional shape of the through-hole is a rectangular shape, and
the fixing portions of the plurality of resonators are arranged to have a trajectory along two parallel sides of the rectangular shape.
15. The spectrum analyzer of claim 1, wherein a center frequency difference between two resonators spatially immediately adjacent to each other, among the plurality of resonators, is greater than a smallest center frequency difference among center frequency differences between the plurality of resonators.
16. A spectrum analyzer comprising:
a support substrate comprising a through-hole having a circle shape; and
a plurality of resonators that have center frequencies different from each other, each of movable portion that faces the through-hole,
wherein length of the plurality of resonators gradually decreases in a direction from a first point on a circumference of the though-hole to a last point on the circumference of the through-hole so that a longest resonator of the plurality of resonators at the first point is immediately adjacent to a shortest resonator of the plurality of resonators at the last point.
17. The spectrum analyzer of claim 16, wherein the plurality of resonators are arranged in a flat formation without overlapping one another.
18. A method of arranging resonators of a spectrum analyzer, the method comprising:
setting a frequency range of frequency f a number N of a plurality of resonators $R_k$, when k is a natural number from 1 to N;
setting center frequencies of the plurality of resonators $R_k$ to be different values within the set frequency range;
setting an arrangement period p of the plurality of resonators $R_k$; and
arranging the plurality of resonators $R_k$ in a plurality of spatially distributed groups, so that a pitch between two resonators of the plurality of resonators $R_k$, which belong to two different groups of the plurality of spatially distributed groups and have the center frequencies immediately adjacent to each other, is 2p or greater, and the center frequencies of resonators in a same group of the plurality of spatially distributed groups gradually decreases or increases.
19. The spectrum analyzer of claim 18, wherein the frequency range is set to be between F1 and F2,
the center frequencies of the plurality of resonators $R_k$ are set to be F1+(k−1)(F2−F1)/(N−1), and the plurality of resonators are arranged so that a center frequency difference between two resonators of the plurality of resonators $R_k$, which are spatially immediately adjacent to each other, is 2(F2−F1)/N or greater.

20. The spectrum analyzer of claim 18, wherein the center frequencies of the plurality of resonators $R_k$ are set at equal-ratio intervals r, and the plurality of resonators $R_k$ are arranged so that a center frequency ratio between two resonators of the plurality of resonators ($R_k$), which are spatially immediately adjacent to each other, is 2r or greater.

21. The spectrum analyzer of claim 18, wherein the plurality of resonators $R_k$ are grouped into m subgroups SG_j when j is a natural number from 1 to m, and m is any one of aliquots of N other than 1 and N, when j is different from m, each of the subgroups SG_j includes resonators $R_k$ satisfying (k mod m)=j, when j is equal to m, each of the subgroups SG_j includes resonators $R_k$ satisfying (k mod m)=0, and resonators $R_k$ belonging to a same subgroup SG_j are arranged adjacent to each other in order of the center frequencies.

22. A spectrum analyzer comprising:

a support substrate comprising a through-hole; and a plurality of resonators, each of the plurality of resonators having a first end that is fixed to the support substrate and a second end that extends from the first end toward the through-hole to be apart from the support substrate, wherein the plurality of resonators are classified into m number of spatially distributed groups, m being a natural number, wherein resonators in a same group among the m number of spatially distributed groups are disposed to be adjacent to each other, wherein a difference between a central frequency of a first resonator in one group of the m number of spatially distributed groups and a central frequency of a second resonator in the one group is a multiplication of m and $\Delta f$, and wherein the $\Delta f$ is F divided by N when F is a frequency range in which each of the plurality of resonators operates and N is a number of the plurality of resonators.

* * * * *